US 11,444,089 B2

(12) United States Patent
Liaw

(10) Patent No.: US 11,444,089 B2
(45) Date of Patent: Sep. 13, 2022

(54) GATE-ALL-AROUND FIELD EFFECT TRANSISTORS IN INTEGRATED CIRCUITS

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 115 days.

(21) Appl. No.: 16/944,454

(22) Filed: Jul. 31, 2020

(65) Prior Publication Data
US 2021/0202498 A1  Jul. 1, 2021

Related U.S. Application Data

(60) Provisional application No. 62/954,202, filed on Dec. 27, 2019.

(51) Int. Cl.
*H01L 27/11* (2006.01)
*H01L 27/092* (2006.01)
(Continued)

(52) U.S. Cl.
CPC .... *H01L 27/1108* (2013.01); *H01L 21/02603* (2013.01); *H01L 21/823807* (2013.01); *H01L 21/823814* (2013.01); *H01L 21/823871* (2013.01); *H01L 21/823878* (2013.01); *H01L 27/0922* (2013.01); *H01L 27/1116* (2013.01); *H01L 29/0673* (2013.01);
(Continued)

(58) Field of Classification Search
CPC ........... H01L 27/1108; H01L 21/02603; H01L 21/823807; H01L 21/823814; H01L 21/823871; H01L 21/823878; H01L 27/0922; H01L 27/1116; H01L 29/0673; H01L 29/42392; H01L 29/66545; H01L 29/66742; H01L 29/78696; H01L 27/1104; H01L 29/775; H01L 27/092; B82Y 10/00
USPC ........................................................ 257/351
See application file for complete search history.

(56) References Cited

U.S. PATENT DOCUMENTS 10,490,559 B1   11/2019   Ando et al.
10,515,859 B2   12/2019   Doris et al.
(Continued)

FOREIGN PATENT DOCUMENTS

KR   20170081796 A   7/2017
KR   20190062312 A   6/2019

*Primary Examiner* — Tong-Ho Kim
(74) *Attorney, Agent, or Firm* — Haynes and Boone, LLP

(57) ABSTRACT

An integrated circuit (IC) that includes a memory cell having a first p-type active region, a first n-type active region, a second n-type active region, and a second p-type active region. Each of the first and the second p-type active regions includes a first group of vertically stacked channel layers having a width W1, and each of the first and the second n-type active regions includes a second group of vertically stacked channel layers having a width W2, where W2 is less than W1. The IC structure further includes a standard logic cell having a third n-type fin and a third p-type fin. The third n-type fin includes a third group of vertically stacked channel layers having a width W3, and the third p-type fin includes a fourth group of vertically stacked channel layers having a width W4, where W3 is greater than or equal to W4.

20 Claims, 25 Drawing Sheets

(51) Int. Cl.
*H01L 29/06* (2006.01)
*H01L 29/423* (2006.01)
*H01L 29/786* (2006.01)
*H01L 21/02* (2006.01)
*H01L 21/8238* (2006.01)
*H01L 29/66* (2006.01)

(52) U.S. Cl.
CPC .. *H01L 29/42392* (2013.01); *H01L 29/66545* (2013.01); *H01L 29/66742* (2013.01); *H01L 29/78696* (2013.01)

(56) References Cited

U.S. PATENT DOCUMENTS

| | | | |
|---|---|---|---|
| 2020/0066725 A1* | 2/2020 | Bhuwalka | H01L 29/78654 |
| 2020/0411515 A1* | 12/2020 | Kim | H01L 29/66439 |
| 2021/0098473 A1* | 4/2021 | Lin | H01L 29/78696 |

* cited by examiner

GATE-ALL-AROUND FIELD EFFECT TRANSISTORS IN INTEGRATED CIRCUITS

CROSS-REFERENCE TO RELATED APPLICATIONS

This is a non-provisional application of and claims priority to U.S. Provisional Patent Application Ser. No. 62/954,202, filed Dec. 27, 2019, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) transistors have been incorporated into memory devices (including, for example, static random-access memory, or SRAM, cells) and core devices (including, for example, standard logic, or STD, cells) to reduce chip footprint while maintaining reasonable processing margins. However, designing IC chips that include GAA transistors for multiple applications involves complex and oftentimes costly processes. Accordingly, although existing technologies for fabricating GAA transistors have been generally adequate for their intended purposes, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
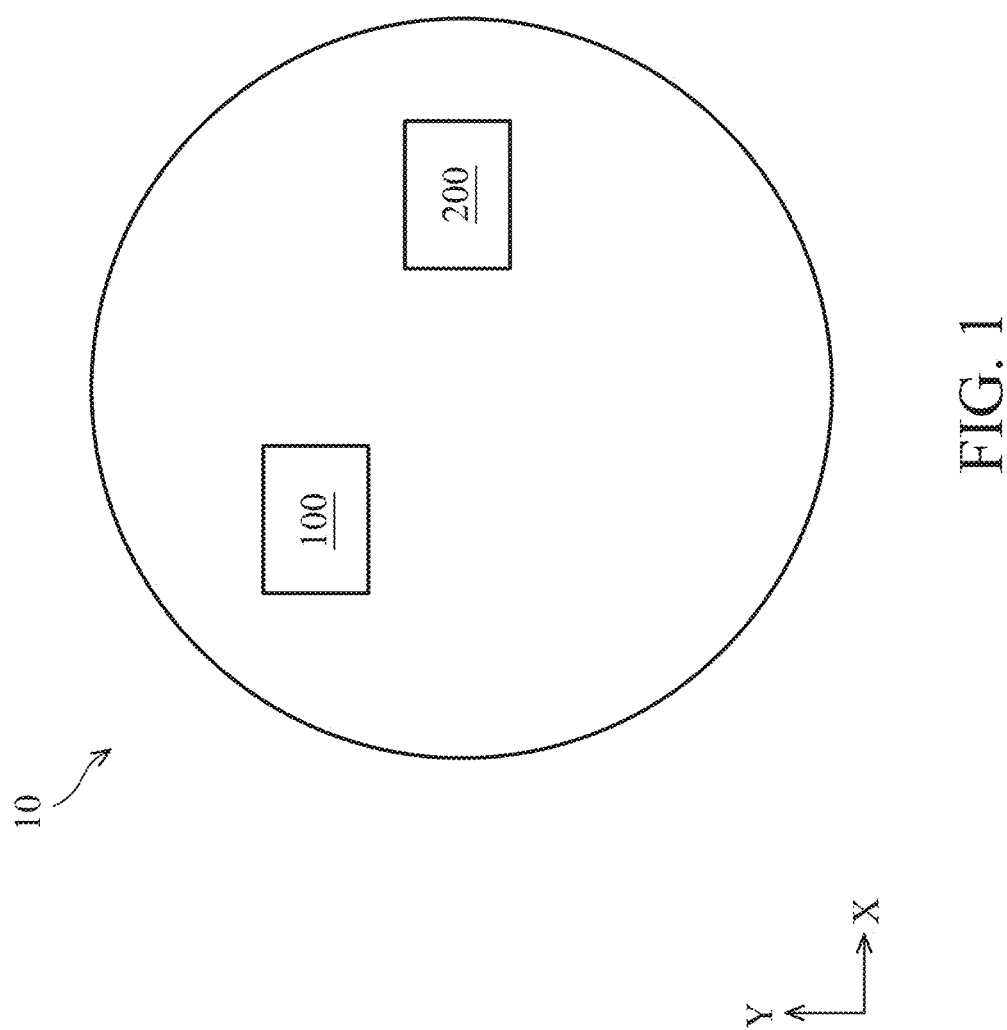
FIG. 1 is a diagrammatic plan view of an IC chip, in portion or entirety, according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional gate-all-around (GAA) FETs, in memory and/or standard logic cells of an integrated circuit (IC) structure. Generally, a GAA FET includes a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. While existing technologies for fabricating GAA FETs have been generally adequate for their intended applications, they have not been entirely satisfactory in all aspects. The present disclosure includes multiple embodiments. Different embodiments may have different advantages, and no particular advantage is necessarily required of any embodiment.

Figures 2A, 2B:
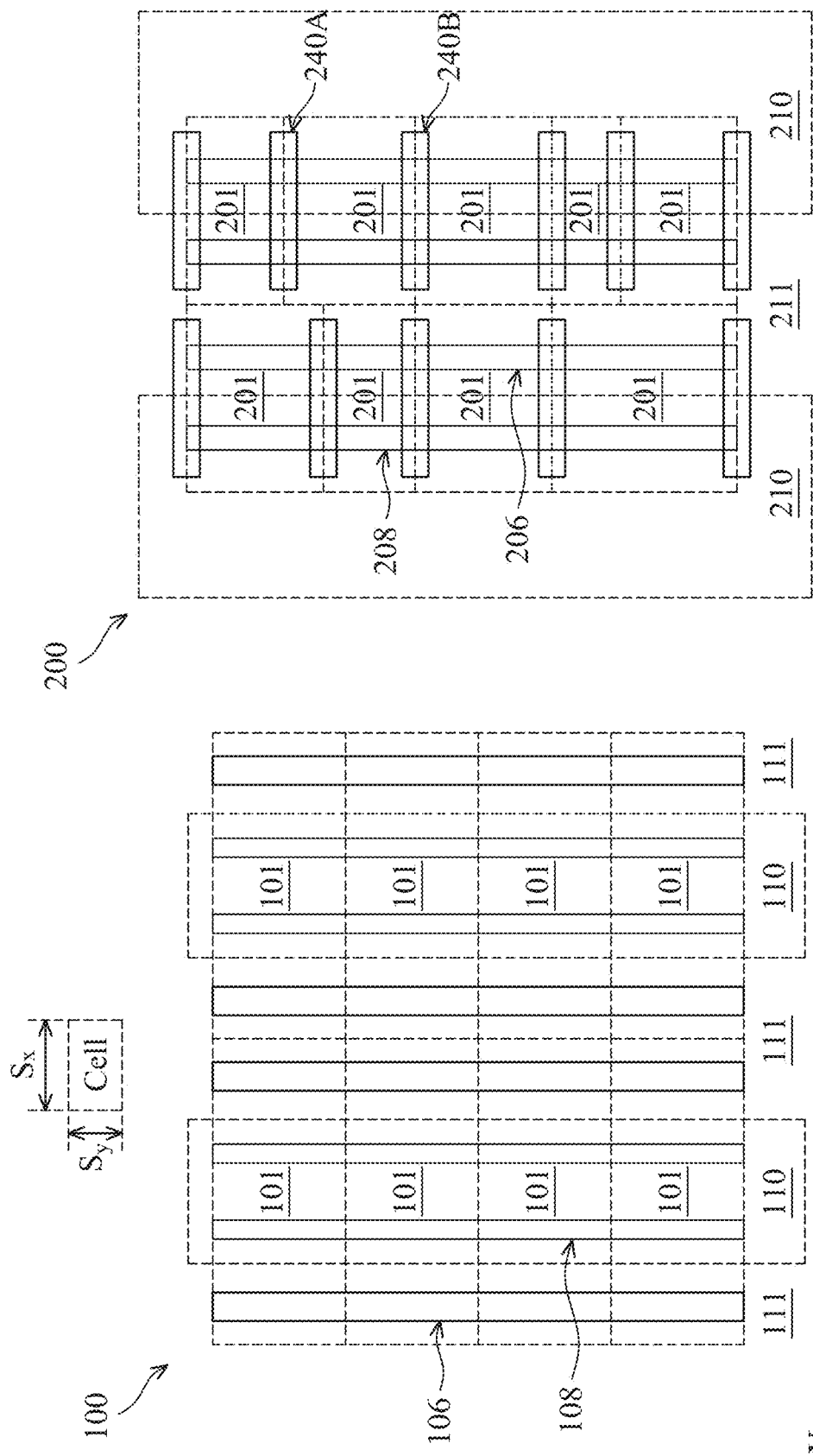
FIGS. 2A and 14A are diagrammatic plan views of an array of SRAM cells, in portion or entirety, according to various aspects of the present disclosure.
FIGS. 2B and 14B are diagrammatic plan views of an array of STD cells, in portion or entirety, according to various aspects of the present disclosure.
Figure 8:
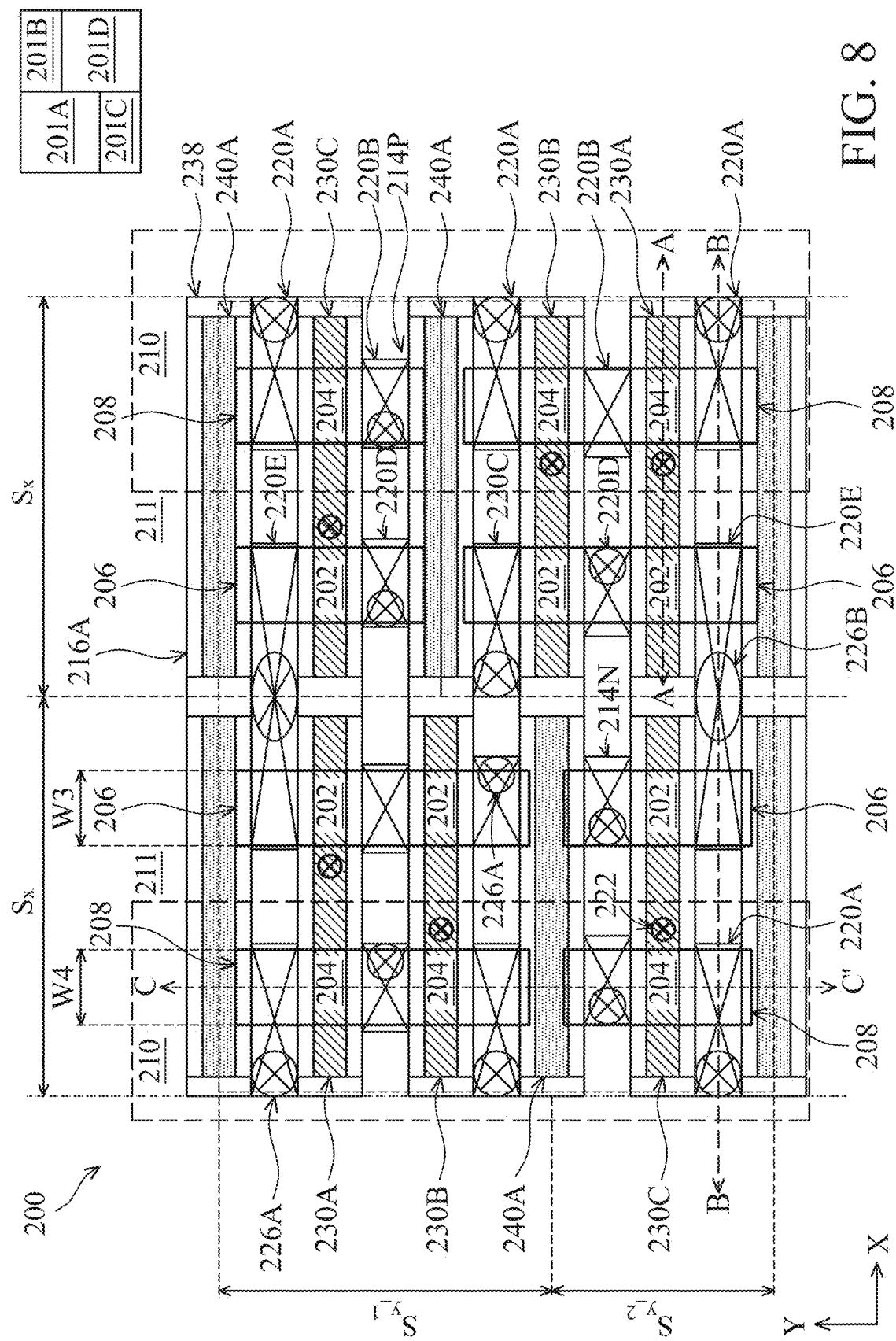
FIGS. 8, 12, and 18 are diagrammatic plan views of an IC structure including the STD cells of FIGS. 2B and/or 14B, in portion or entirety, according to various aspects of the present disclosure.

Referring to FIGS. 1, 2A, and 2B, the present disclosure provides an IC structure 10 formed over a semiconductor substrate and includes at least an array 100 of memory cells and an array 200 of standard logic (STD) cells. The array 100 may include static random-access memory (SRAM) cells, dynamic random-access memory (DRAM) cells, nonvolatile random-access memory (NVRAM) cells, flash memory cells, other suitable memory cells, or combinations thereof. In the present embodiments, the array 100 includes a plurality of SRAM cells 101, which generally provide memory or storage that can retain data only when power is applied. As such, the array 100 is hereafter referred to as SRAM array 100. In the present embodiments, the IC structure 10 further includes STD cells 201 (e.g., STD cells 201A-201D as depicted in FIG. 8 for example) each configured to provide various standard logic devices, such as inverter, AND, NAND, OR, XOR, NOR, other suitable devices, or combinations thereof. The STD cells 201 may be predesigned according to manufacturing technologies, saved in a STD cell library, and repeatedly used in various IC designs to streamline the fabrication process. The STD array 200 may include other frequently used circuit blocks, such flip-flop circuit and latch. In the present embodiments, each SRAM cell 101 and STD cell 201 provides one or more GAA FETs to be discussed in detail below. Though not depicted herein, the IC chip 10 may further include various passive and active microelectronic devices, such as resistors, capacitors, inductors, diodes, p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other suitable devices, or combinations thereof. Additional features can be added to the IC structure 10 and some of the features described below can be replaced, modified, or eliminated in other embodiments of the IC structure 10.

Referring to FIG. 2A, each SRAM cell 101 is configured to include p-type three-dimensional fin-like active regions 106 (hereafter referred to as p-type fins 106) each disposed in a p-type doped region 111 (hereafter referred to as p-well 111) and n-type three-dimensional fin-like active regions 108 (hereafter referred to as n-type fins 108) each disposed in an n-type doped region 110 (hereafter referred to as n-well 110), which is interposed between two p-wells 111. The p-type fins 106 and the n-type fins 108 are oriented lengthwise along Y-axis and spaced from each other along X-axis, which is substantially perpendicular to the Y-axis. As will be discussed in detail below, each p-type fin 106 includes a first set of vertically stacked semiconductor layers configured to provide channel regions of n-type GAA FETs, and each n-type fin 108 includes a second set of vertically stacked semiconductor layers configured to provide channel regions of p-type GAA FETs. In many embodiments, the second set of vertically stacked semiconductor layers differ from the first set of vertically stacked semiconductor layers in at least one dimension along the X-axis. Each SRAM cell 101 may be defined by a long pitch $S_x$ along the X-axis and a short pitch $S_y$ along the Y-axis. In the present embodiments, the p-type fins 106 and n-type fins 108 extend across each SRAM cell 101 along the Y-axis, such that at least two adjacent SRAM cells 101 share common p-type fins 106 and n-type fins 108. Various SRAM cells 101 may be configured for similar applications, such as a high-speed application, a low-power application, a super high-speed application, other suitable applications, or combinations thereof. Alternatively, different SRAM cells 101 may be configured for different applications and designed with different specifications (e.g., dimensions, layout designs, etc.) accordingly.

Referring to FIG. 2B, each STD cell 201 is configured to include p-type three-dimensional fin-like active region 206 (hereafter referred to as p-type fins 206) each disposed in a p-type doped region 211 (hereafter referred to as p-well 211) and n-type three-dimensional fin-like active regions 208 (hereafter referred to as n-type fins 208) each disposed in an n-type doped region 210 (hereafter referred to as n-well 210), which is interposed between p-wells 211. The p-type fins 206 and the n-type fins 208 are oriented lengthwise along the Y-axis and spaced from each other along the X-axis. As will be discussed in detail below, each p-type fin 206 includes a first set of vertically stacked semiconductor layers configured to provide channel regions of n-type GAA FETs, and each n-type fin 208 includes a second set of vertically stacked semiconductor layers configured to provide channel regions of p-type GAA FETs. Similar to the SRAM cell 101, each STD cell 201 may be defined by the long pitch $S_x$ along the X-axis and the short pitch $S_y$ along the Y-axis. However, because different STD cells 201 may be directed to different applications, the STD cells 201 in the STD array 200 may differ in dimension and layout design. In some embodiments, adjacent STD cells 201 disposed along the Y-axis may be physically separated by dielectric gate structures 240A oriented lengthwise along the X-axis, such that the p-type fins 206 and the n-type fins 208 are discontinuous across the adjacent STD cells 201. In some embodiments, adjacent STD cells 201 disposed along the Y-axis may be electrically separated by isolation gate structures 240B (e.g., conductive gate structures configured to form isolation devices with fin structures) without the p-type fins 206 and the n-type fins 208 being physically separated at the cell boundaries.

Figure 3:
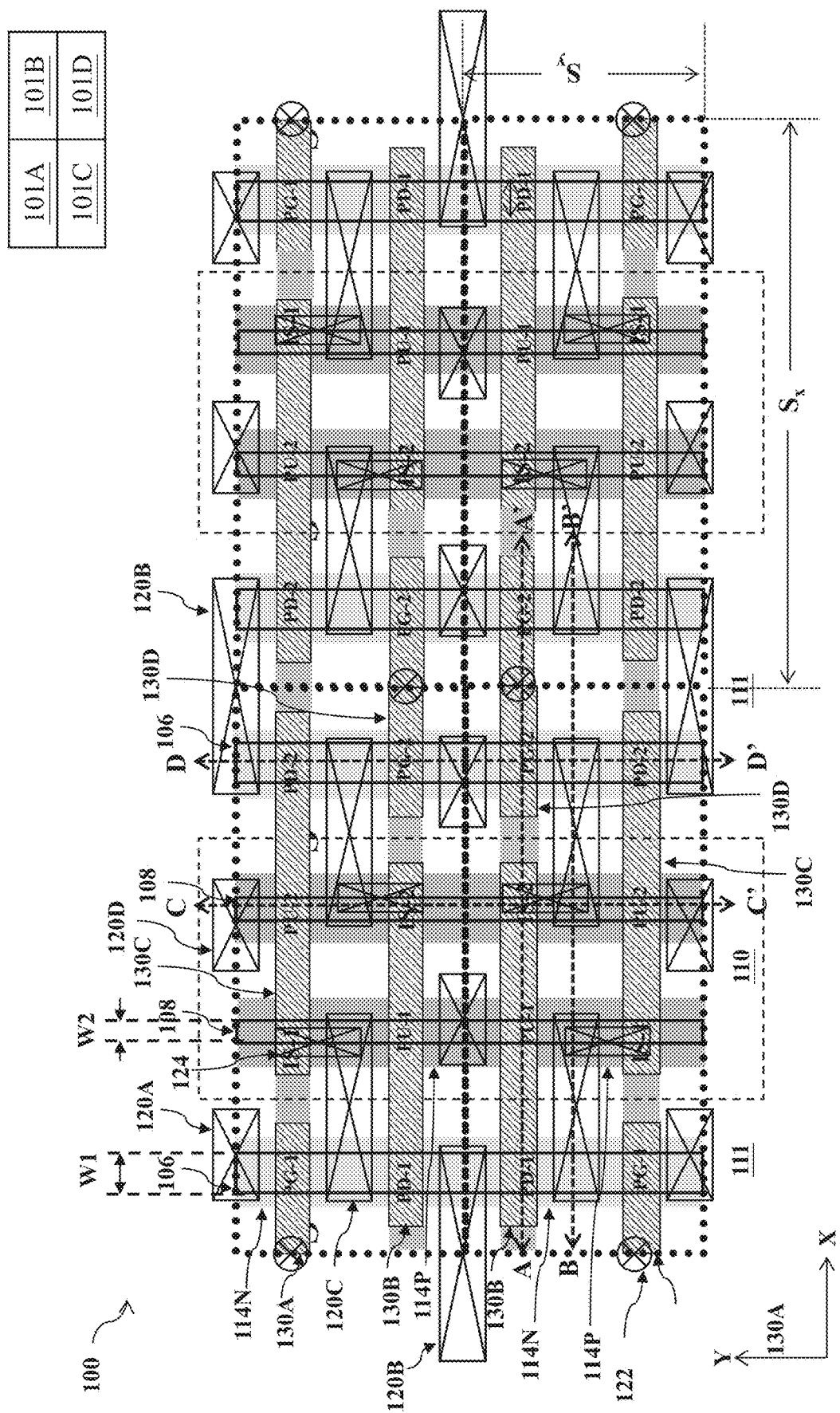
FIGS. 3 and 15 are diagrammatic plan views of an IC structure including the SRAM cells of FIGS. 2A and/or 14A, in portion or entirety, according to various aspects of the present disclosure.
Figure 4:
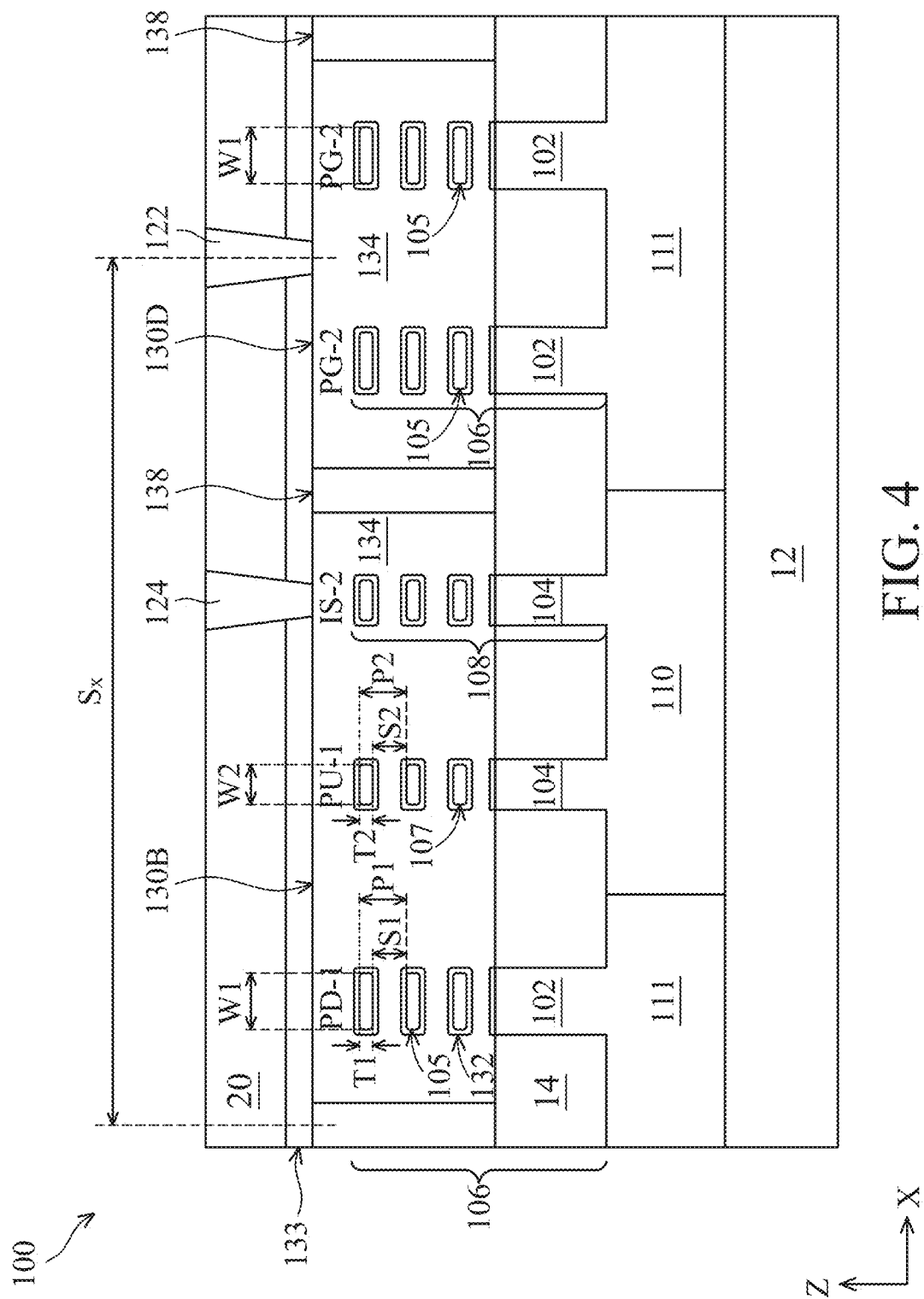
FIGS. 4, 16, and 19 are cross-sectional views of the IC structures along line AA' of FIGS. 3, 15, and 18, respectively, in portion or entirety, according to various aspects of the present disclosure.
Figure 5:
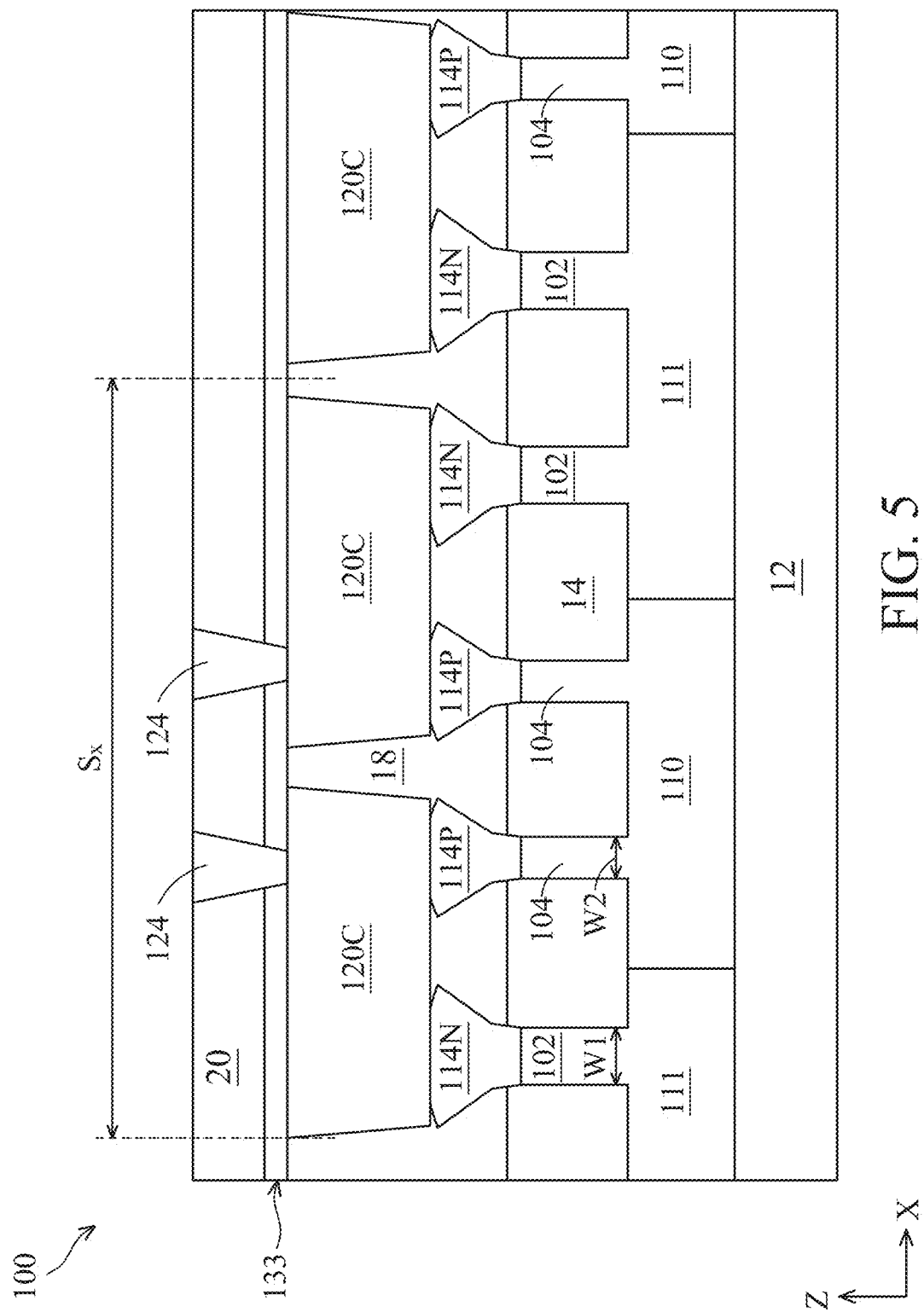
FIGS. 5, 10, 17, and 20 are cross-sectional views of the IC structures along line BB' of FIGS. 3, 8, 15, and 18, respectively, in portion or entirety, according to various aspects of the present disclosure.
Figure 6:
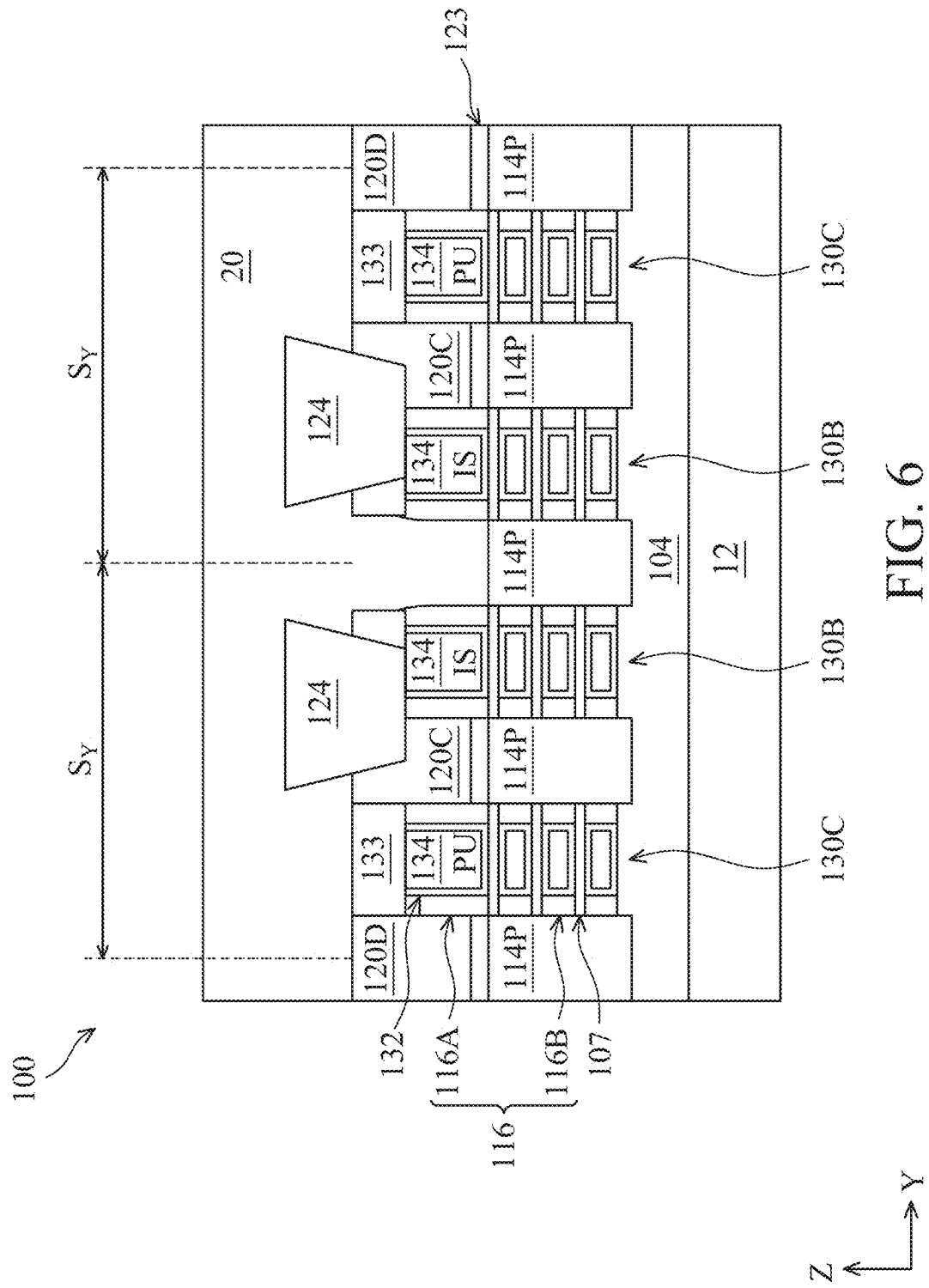
FIGS. 6, 11, and 13 are cross-sectional views of the IC structures along line CC' of FIGS. 3, 8, and 12, respectively, in portion or entirety, according to various aspects of the present disclosure.
Figure 7A:
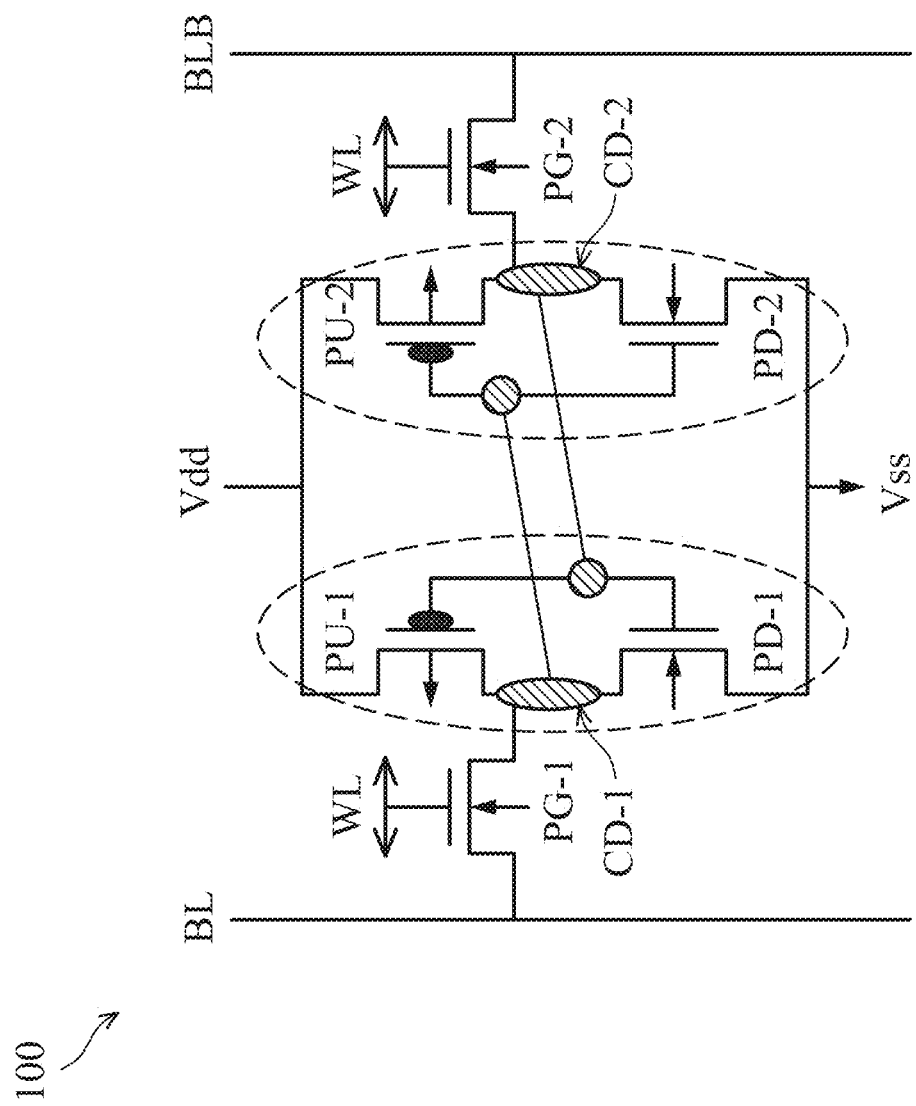
FIG. 7A is a schematic illustration of an IC structure including the SRAM cells of FIGS. 2A and/or 14A, in portion or entirety, according to various aspects of the present disclosure.
Figure 7B:
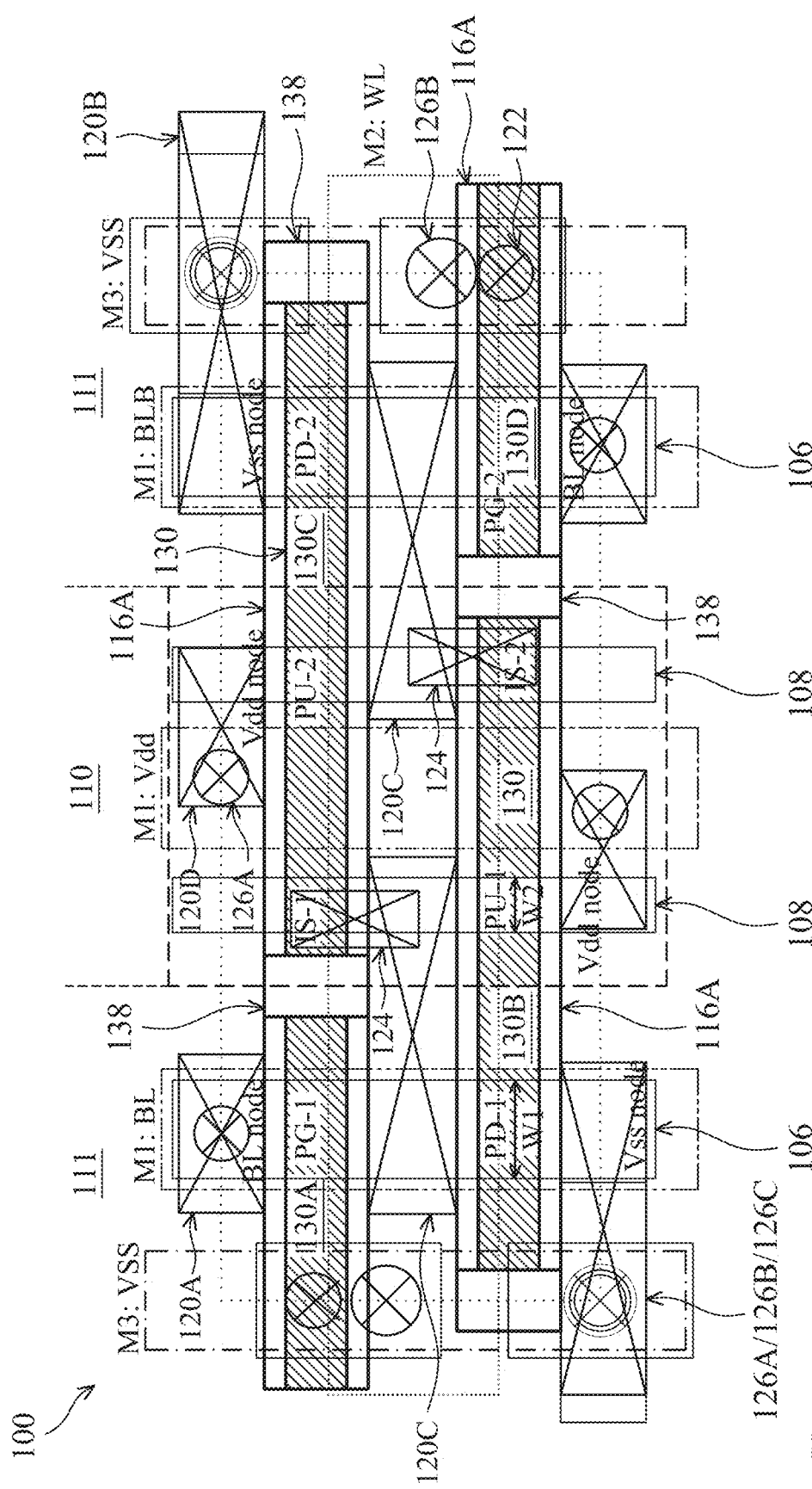
FIG. 7B is a diagrammatic plan view of an IC structure including the SRAM cells of FIGS. 2A and/or 14A, in portion or entirety, according to various aspects of the present disclosure.
Figure 9:
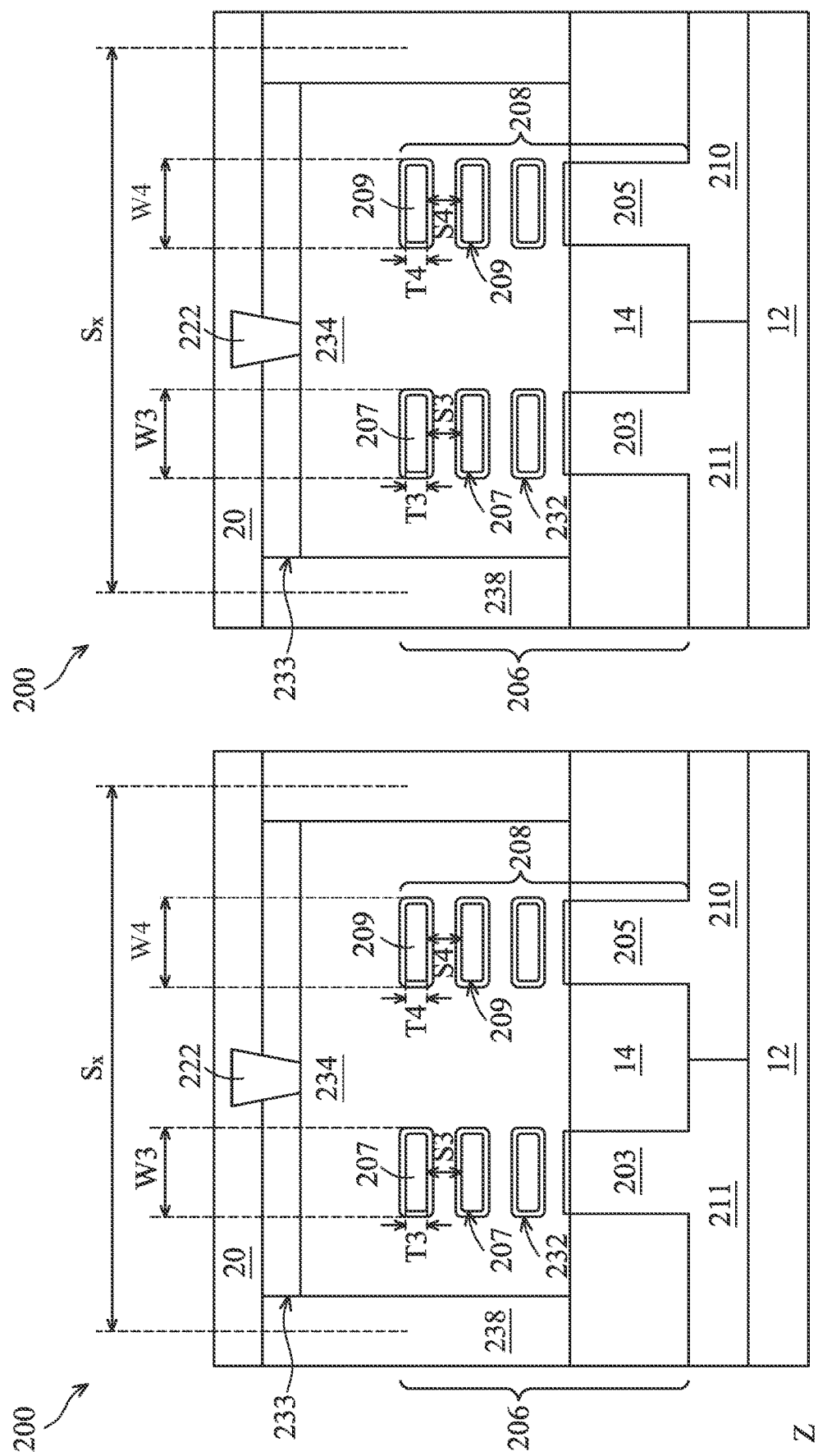
FIGS. 9A and 9B are cross-sectional views of the IC structures along line AA' of FIG. 8, in portion or entirety, according to various aspects of the present disclosure.
Figure 10:
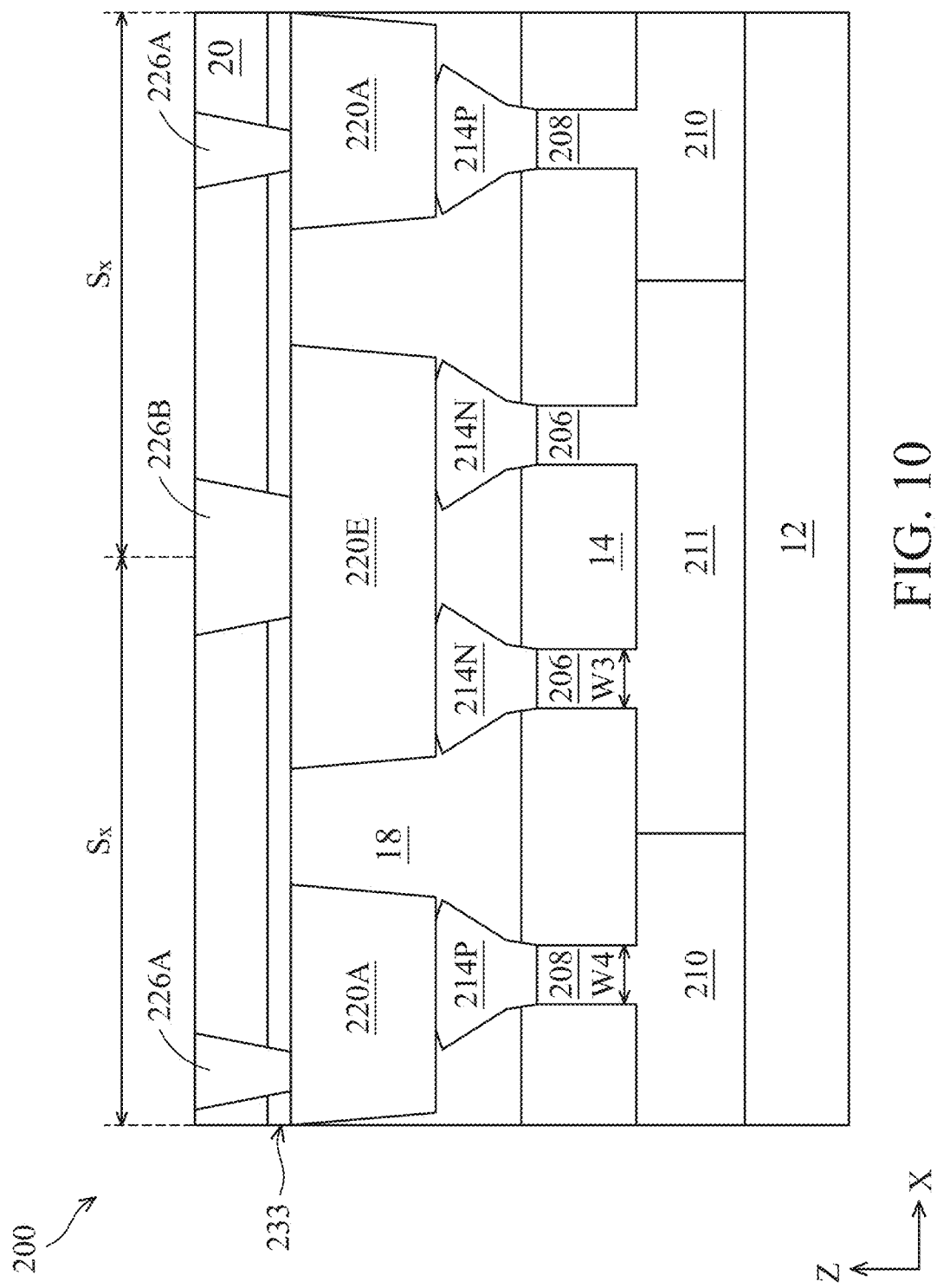
Figure 11:
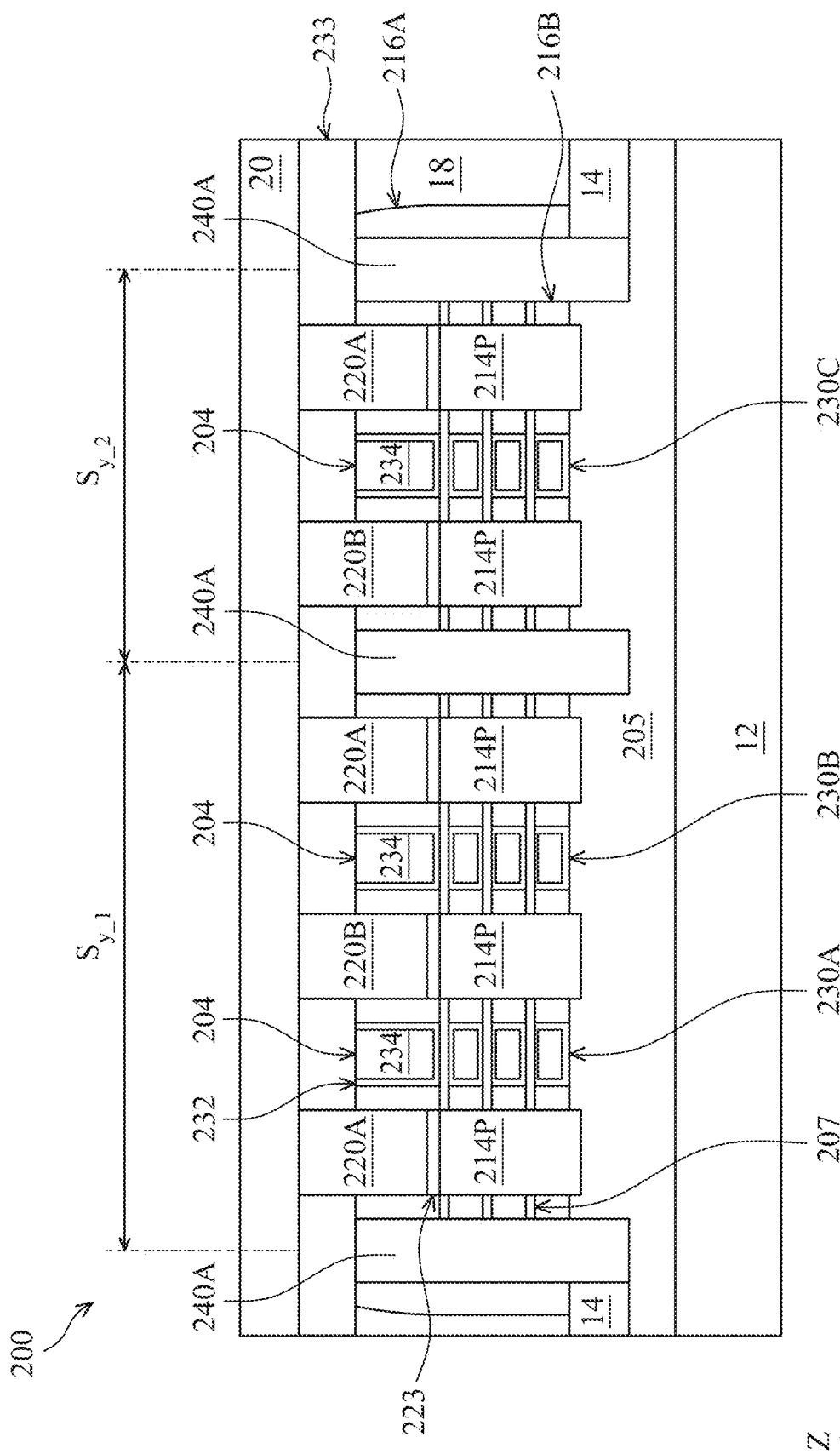
Figure 12:
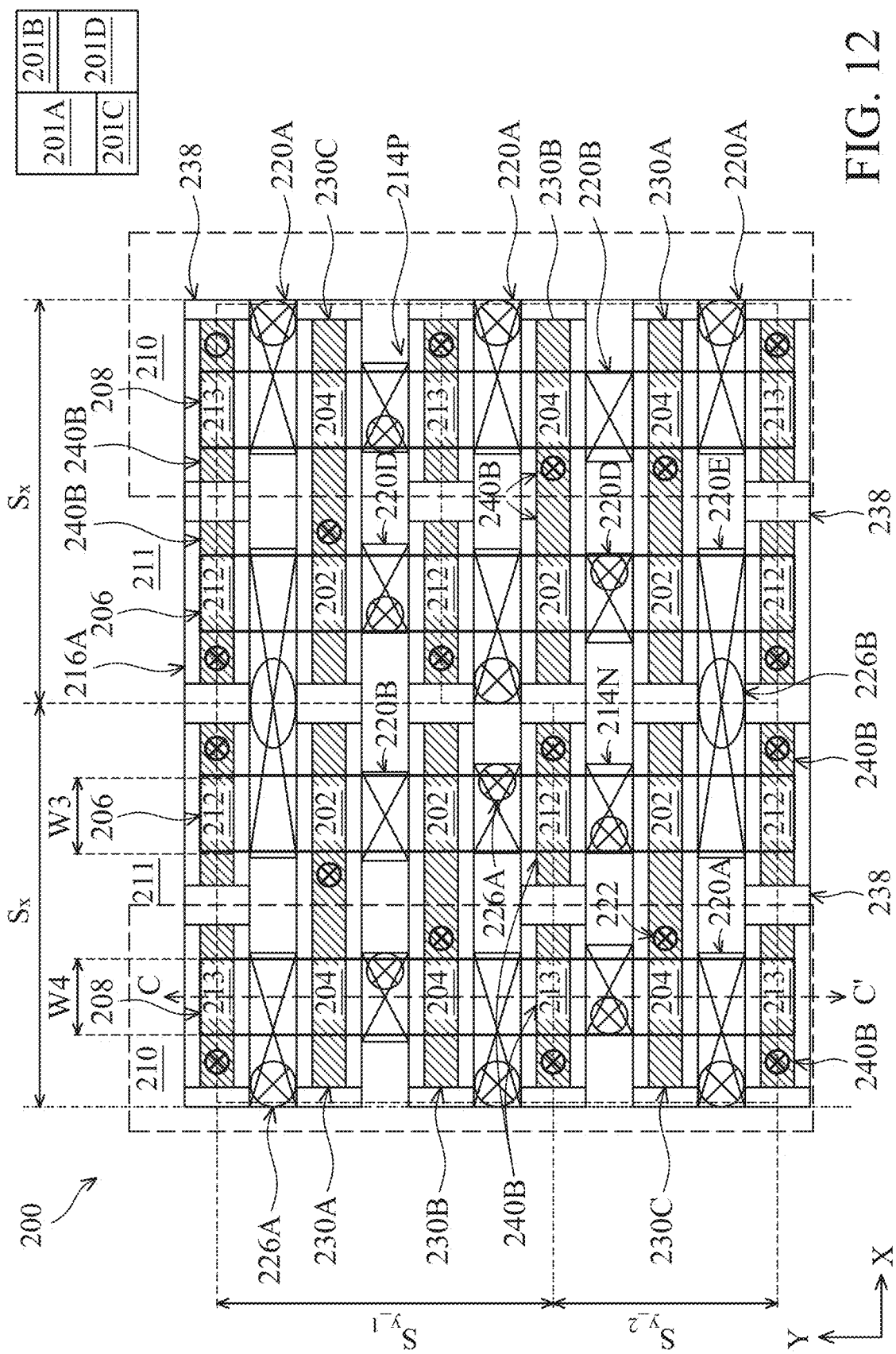
Figure 13:
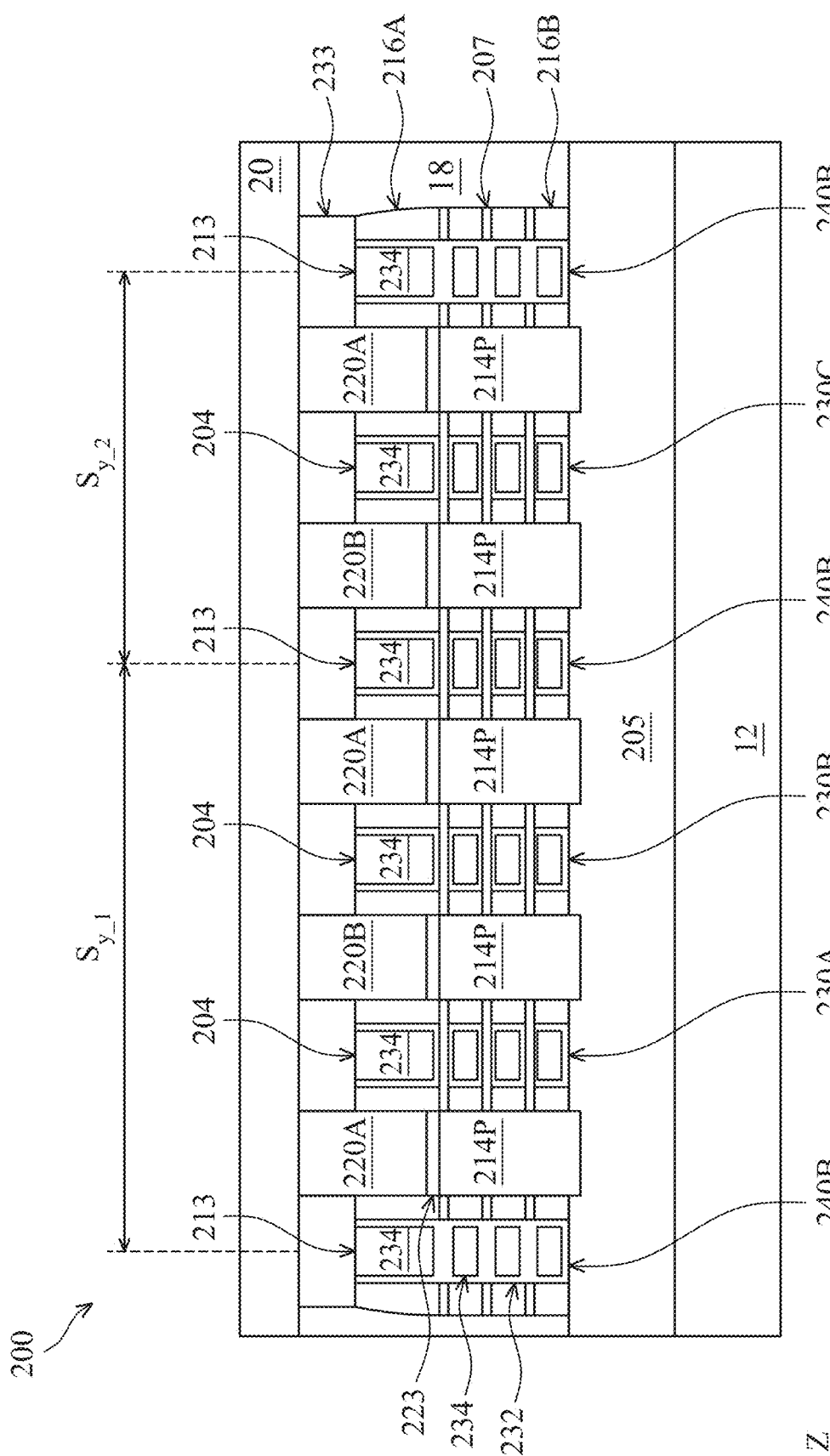

Various embodiments of portions of the SRAM array 100 and the STD array 200 are discussed in detail below. FIGS. 3-7B depict embodiments of a portion of the SRAM array 100 that includes multiple SRAM cells 101; of which, FIGS. 3 and 7B are schematic planar top views of embodiments of the SRAM cells 101, FIG. 4 is a schematic cross-sectional view of FIG. 3 taken along line AA', FIG. 5 is a schematic cross-sectional view of FIG. 3 taken along line BB', FIG. 6 is a schematic cross-sectional view of FIG. 3 taken along line CC', and FIG. 7A is a schematic illustration of embodiments of the SRAM cells 101. FIGS. 8-13 depict embodiments of a portion of the STD array 200 that includes multiple STD cells 201; of which, FIGS. 8 and 12 are schematic planar top views of embodiments of the STD cells 201, FIGS. 9A and 9B are a schematic cross-sectional views of FIG. 8 taken along line AA', FIG. 10 is a schematic cross-sectional view of FIG. 8 taken along line BB', and FIGS. 11 and 13 are schematic cross-sectional views of FIGS. 8 and 12, respectively, taken along line CC'.

Referring to FIG. 3, a portion of the SRAM array 100 including four SRAM cells 101A, 101B, 101C, and 101D are schematically depicted in a planar top view. It is noted that FIG. 3 has been simplified for the sake of clarity to better illustrate embodiments of the present disclosure. As such, additional features can be added to the SRAM array 100, and some of the features described below can be replaced, modified, or eliminated in other embodiments of the SRAM cells 101A-101D. In the depicted embodiments, the SRAM cells 101A-101D are substantially the same in size, i.e., the SRAM cells 101A-101D have substantially the same $S_x$ and $S_y$ as defined above. As such, the SRAM cells 101A-101D may be generally referred to as the SRAM cells 101 for purposes of simplicity. In the present embodiments, each SRAM cell 101 includes two p-type fins 106 each disposed in a p-type well 111 and two n-type fins 108 disposed in an n-type well 110 interposing between two p-type wells 111. In the present embodiments, the p-type fins 106 and the n-type fins 108 extend continuously along the Y-axis across at least two SRAM cells 101. In other words, the p-type fins 106 and the n-type fins 108 are not truncated at cell boundaries (dotted line) along the X-axis. Continuous p-type fins 106 and n-type fins 108 may benefit the overall performance of each SRAM cell 101 by offering more uniform and symmetric fin profiles between active regions of different conductivity types, providing better line end control for PFETs (e.g., pull-up, or PU, transistors formed on n-type fins 108), and as a result, extending strapping frequency of the n-wells 110 without expanding layout size of the SRAM cell 101.

The SRAM cell 101 further includes a plurality of gate stacks, such as gate stacks 130A, 130B, 130C, and 130D depicted herein, oriented lengthwise along the X-axis and disposed over the p-type fins 106 and/or the n-type fins 108 to form various transistors. Each gate stack traverses a channel region of a p-type fin 106 or an n-type fin 108. In some examples, adjacent gate stacks along the X-axis may be separated by gate isolation features 138. In the depicted embodiments, a portion of the gate stack 130A engages with a fist p-type fin 106 to form a first pass-gate transistor (PG-1); portions of the gate stack 130B engage with the first p-type fin 106 and a first n-type fin 108 to form a first pull-down transistor (PD-1) and a first pull-up transistor (PU-1), respectively; portions of the gate stack 130C engage with a second p-type fin 106 and a second n-type fin 108 to form a second pull-down transistor (PD-2) and a second pull-up transistor (PU-2), respectively; and a portion of the gate stack 130D engages with the second p-type fin 106 to form a second pass-gate transistor (PG-2). In some embodiments, the PU-1 and the PU-2 are configured as p-type transistors, while the PD-1, the PD-2, the PG-1, and the PG-2 are configured as n-type transistors. In many embodiments, the pull-down transistors PD-1 and PD-2 and the pull-up transistors PU-1 and PU-2 are configured to provide two cross-coupled inverters as data storage devices, while the pass-gate transistors PG-1 and PG-2 are configured to provide control units for reading and writing the data. In some embodiments, a portion of the gate stack 130C engages with the first n-type fin 108 to form a first isolation transistor (IS-1) and a portion of the gate stack 130B engages with the second n-type fin 108 to form a second isolation transistor (IS-2). In the present embodiments, the IS-1 and IS-2 are configured to accommodate the continuous structures of the n-type fins 108 and thus have minimal or negligible operational effect on the performance of the SRAM cell 101.

Now referring to FIG. 4, which is an embodiment of a cross-sectional view of FIG. 3 along line AA', the SRAM array 100 (as a portion of the IC structure 10) is formed over a semiconductor substrate (or a wafer) 12 having a plurality of p-wells (p-type doped regions) 111 and n-wells (n-type doped regions) 110 formed therein (and/or thereover) according to various design requirements of the SRAM array 100. In the depicted embodiments, the portion of the substrate 12 within each SRAM cell 101 includes an n-well 110 disposed between two p-wells 111. The n-well 110 is configured to provide at least one PFET, such as a pull-up (PU) transistor or an isolation (IS) transistor; and each p-well 111 is configured to provide at least one NFET, such as a pull-down (PD) transistor or a pass-gate (PG) transistor. In some embodiments, the substrate 12 includes additional doped regions configured to provide one or more transistors according to design requirements of the SRAM array 100. The SRAM array 100 further includes isolation structures 14 disposed over the substrate 12 to electrically separate various active regions formed over the substrate 12. In the present embodiments, the isolation structures 14 include shallow trench isolation (STI) features.

Still referring to FIG. 4, each p-type fin 106 includes a stack of semiconductor layers 105 disposed over a base fin 102; similarly, and each n-type fin 108 includes a stack of semiconductor layers 107 disposed over a base fin 104. In the present embodiments, the semiconductor layers 105 and 107 are generally oriented lengthwise along the Y-axis and stacked vertically along the Z-axis. Furthermore, each stack of the semiconductor layers 105 interposes n-type source/drain (S/D) features 114N (not depicted in FIG. 4) formed over the base fin 102, and each stack of the semiconductor layers 107 interposes p-type S/D features 114P (not depicted in FIG. 4) formed over the base fin 104. In the present embodiments, the semiconductor layers 105 are suspended in (or wrapped around by) one of the gate stacks 130A-130D (e.g., the gate stack 130B or the gate stack 130D as depicted in FIG. 4) to form a GAA NFET (e.g., PD-1, PD-2, PG-1, or PG-2), and the semiconductor layers 107 are suspended in (or wrapped around by) one of the gate stacks 130A-130D (e.g., the gate stack 130B depicted in FIG. 4) to form a GAA PFET (e.g., PU-1, PU-2, IS-1, or IS-2). In other words, each stack of the semiconductor layers 105 engages with a portion of the gate stack 130A-130D to form a channel region of a GAA NFET, and each stack of the semiconductor layers 107 engages with a portion of the gate stack 130A-130D to form a channel region of a GAA PFET. As such, the semiconductor layers 105 are hereafter referred to as channel layers 105, and the semiconductor layers 107 are hereafter referred to as channel layers 107 for purposes of clarity.

Each of the channel layers 105 and 107 may include Si, Ge, SiC, SiGe, GeSn, SiGeSn, SiGeCSn, other suitable semiconductor materials, or combinations thereof. In the present embodiments, each of the semiconductor layers 105 and 107 includes Si in the form of a nanosheet, a nanowire (e.g., a nanowire having a hexagonal cross-section), a nanorod (e.g., a nanorod having a square or round cross-section), or other suitable configurations. In some embodiments, the p-type fin 106 and the n-type fin 108 each include two to ten channel layers 105 and 107, respectively. For example, the p-type fin 106 and the n-type fin 108 may each include three channel layers 105 and three channel layers 107, respectively. Of course, the present disclosure is not limited to such configurations and the number of semiconductor layers may be tuned according to design requirements for the IC structure 10. Each stack of the channel layers 105 and 107 may be defined by a width of the stack (described in detail below) measured along the lengthwise direction of the gate stacks 130A-130D, a layer thickness measured along the stacking direction of the channel layers, and a separation distance between adjacent layers. For example, each stack of the channel layers 105 has a width of W1, a layer thickness of T1, and a layer separation distance of S1, and each stack of the channel layers 107 has a width of W2, a layer thickness of T2, and a layer separation distance of S2. In the present embodiments, W1 is greater than W2, T1 is substantially the same as T2, and S1 is substantially the same as S2. Accordingly, a layer pitch P1, which is the sum of the layer thickness and the layer separation distance, of the stack of the channel layers 105 is substantially the same as a layer pitch P2 of the channel layers 107. It is noted that "substantially the same" as used in the present disclosure refers to a difference within about ±5% between two values. In some examples, the sheet thickness T1 and T2 may each be about 4 nm to about 8 nm; the sheet separation distance S1 and S2 may each be about 6 nm to about 15 nm; and the layer pitch P1 and P2 may be about 10 nm to about 23 nm. Of course, other dimensions of the layer thickness, the layer separation distance, and the layer pitch may also be applicable to embodiments of the present disclosure.

The term "width" used herein refers to a lateral distance of each channel layer measured along the general lengthwise direction of the gate stacks 130A-130D (i.e., the X-axis) averaged over multiple channel layers in their stacking direction (i.e., the Z-axis). As discussed above, W1 of each channel layers 105 is greater than W2 of the stack of the channel layers 107 by at least about 10% of W2. In some embodiments, a ratio of the W1 to W2 is about 1.1 to about 4. In the present embodiments, relatively narrower channel region of a GAA PFET (e.g., PU-1, PU-2, etc.) in an SRAM cell (e.g., the SRAM cell 101) provides at least the benefit of reducing cell size and increasing the cell's write margin (i.e., processing speed). This is because the write margin of a SRAM cell is typically determined by a ratio of $I_{on}$ of a pass-gate transistor ($I_{on}$_PG) to $I_{on}$ of a pull-up transistor ($I_{on}$_PU), which is generally proportional to a ratio of W1 to W2 as defined in the present embodiments. Furthermore, because carrier mobility in a GAA NFET is generally greater than carrier mobility in a GAA PFET, especially along the vertical stacking direction of the channel layers (which is generally the <100> direction in crystalline Si), increasing the write margin may be accomplished by increasing W1 of the channel layers 105 in the GAA NFET and/or decreasing W2 of the channel layers 107 in the GAA PFET for an increased ratio of W1 to W2. A ratio of about 1.1 accounts for a minimal difference between the width of the channel layers 105 and the width of the channel layers 107 that is capable of producing a gain on the processing speed of the SRAM cell 101 as provided herein. While the present embodiments are not limited to such range of ratios, specific ratios of W1 to W2 may be determined based on factors such as a size of the SRAM cell 101 suitable for a desired IC application. In some examples, W1 may be about 8 nm to about 40 nm and W2 may be about 5 nm to about 20 nm.

As discussed above, each of the gate stacks 130A-130D engages with the channel layers 105 or channel layers 107 to form various GAA FETs in the SRAM cell 101. Still referring to FIG. 4, the PD-1, PU-1, and IS-2 share a common gate stack 130B, while two PG-2 in adjacent SRAM cells 101 share a common gate stack 130D. In the present embodiments, the gate stacks 130A-130D are high-k metal gate structures and thus each include at least a high-k gate dielectric layer 132 wrapping around (i.e., disposed on all surfaces of) each channel layer 105 and 107 and a metal gate electrode 134 disposed over the high-k gate dielectric layer 132. Though not depicted, the metal gate electrode 134 may include a bulk conductive layer disposed over at least one work function metal layer. Each gate stack 130A-130D may further include gate spacers 116, including top spacers 116A and inner spacers 116B, disposed on its sidewalls, the details of which are discussed below with respect to FIG. 6.

Still referring to FIG. 4, the SRAM array 100 may further include an etch-stop layer (ESL) 133 disposed over the gate stacks 130A-130D, an interlayer dielectric (ILD) layer 20 disposed over the ESL 133, a gate contact 122 disposed in the ILD layer 20 to contact a portion of the gate stack 130D, and a butted contact (BCT) 124 disposed in the ILD layer 20 over an isolation transistor (e.g., IS-2 depicted in FIG. 4), which is a GAA PFET as discussed above. In the present embodiments, the BCT 124 is configured to couple together the gate terminal (as a portion of the gate stack 130B as depicted in FIG. 4) and the drain terminal of each of the IS-1 and IS-2, producing minimal or negligible effect on the operation of the SRAM array 100. A detailed schematic of an embodiment of the interconnect structures of the SRAM cell 101 is shown in and discussed with reference to FIG. 7.

FIG. 5, a cross-sectional view of FIG. 3 taken along line BB', depicts the S/D regions of the GAA FETs as shown in FIG. 4. In the present embodiments, the GAA NFETs (e.g., PD-1, PD-2, PG-1, and PG-2) include n-type S/D features 114N grown over the S/D regions of the base fins 102, and the GAA PFETs (e.g., PU-1, PU-2, IS-1, and IS-2) include p-type S/D features 114P grown over the S/D regions of the base fins 104. The n-type S/D features 114N and the p-type S/D features 114P each include one or more epitaxially grown semiconductor material doped with a dopant of a suitable conductivity type (n-type or p-type, respectively). In such embodiments, the n-type S/D features 114N and the p-type S/D features 114P are grown from and wrap at least a top portion of base fins 102 and 104, respectively. In some examples, one or more of the n-type S/D features 114N and the p-type S/D features 114P may be merged, such that they span over more than one fins.

Referring to FIGS. 3 and 5, the SRAM cells 101 may further include a plurality of S/D contacts 120A, 120B, 120C, and 120D oriented lengthwise along the X-axis. Each S/D contact 120A is disposed over one S/D feature 114N, each S/D contact 120B is disposed over two adjacent S/D features 114N, each S/D contact 120C is disposed over an S/D feature 114N and an adjacent S/D feature 114P, and each S/D contact 120D is disposed over one S/D feature 114P. In the present embodiments, as depicted in FIG. 5, each of the S/D contacts 120A-120D physically contacts a top surface of one or more S/D features over which it is formed. As such, different S/D contacts 120A-120D may vary in length along the X-axis depending upon the number of S/D feature(s) and/or the separation distance between two adjacent S/D features over which they are formed. In the present embodiments, each SRAM cell 101 includes at least two full S/D contacts 120C and portions of the S/D contacts 120A, 120B, and 120D. The S/D contacts 120A-120D may alternatively be referred to as device-level contacts to be differentiated from other contact features (e.g., vias) subsequently formed as portions of a multi-layer interconnect (MLI) structure. Furthermore, as depicted in FIG. 5, the S/D contact (e.g., the S/D contact 120C) disposed over an S/D region of each of the isolation transistors IS-1 and IS-2 is electrically coupled to the gate terminal of the same device via the BCT 124.

Further details of the various GAA FETs of the SARM cell 101 are depicted in FIG. 6, which is a cross-sectional view of FIG. 3 taken along line CC' (e.g., lengthwise through one of the n-type fins 108) across two adjacent SRAM cells 101 along the Y-axis. For example, each of the gate stacks 130A-130D (e.g., the gate stacks 130B and 130C illustrated in FIG. 6), which interposes two S/D features (114P or 114N), includes an upper portion disposed above a topmost channel layer (107 or 105) and a lower portion that wraps around the plurality of the channel layers (107 or 105). In the present embodiments, the top spacers 116A are disposed on sidewalls of the upper portion of each of the gate stacks 130A-130D, while the inner spacers 116B are disposed on sidewalls of the lower portion of each of the gate stacks 130A-130D and separate the gate stack from the adjacent S/D features. Each SRAM cell 101 may further include a silicide layer 123 disposed between the S/D features 114P and 114N and their respective S/D contacts 120A-120D.

FIGS. 7A and 7B depict embodiments of the portion of the SRAM array 100 of FIG. 3, detailing various connections between the GAA FETs provided in the SRAM cells 101 as well as between the GAA FETs and additional IC structures (e.g., the MLI structure) disposed over the GAA FETs. In the present embodiments, a gate terminal of the pull-up transistor PU-1 interposes a source terminal (electrically coupled to a power supply voltage ($V_{DD}$)) and a first common drain (CD1), and a gate terminal of the pull-down transistor PD-1 interposes a source terminal (electrically coupled to a power supply voltage ($V_{SS}$)) and CD1. A gate terminal of the pull-up transistor PU-2 interposes a source terminal (electrically coupled to $V_{DD}$) and a second common drain (CD2), and a gate terminal of the pull-down transistor PD-2 interposes a source terminal (electrically coupled to $V_{SS}$) and CD-2. In some embodiments, CD1 is a storage node (SN) that stores data in true form, and CD2 is a storage node (SNB) that stores data in complementary form. A gate terminal of the pass-gate transistor PG-1 interposes a source terminal (electrically coupled to a bit line (BL)) and a drain terminal electrically coupled with CD1. A gate terminal of the pass-gate transistor PG-2 interposes a source terminal (electrically coupled to a complementary bit line (BLB)) and a drain terminal electrically coupled with CD1. The gate terminals of PG-1 and PG-2 are electrically coupled to a word line (WL). In some embodiments, each SRAM cell 101 includes two cross-coupled inverters (outlined by the dotted lines in FIG. 7A): a first inverter comprising PU-1 and PD-1, and a second inverter comprising PU-2 and PD-2. In some embodiments, PG-1 and PG-2 provide access to SN and SNB, respectively, during read operations and/or write operations. For example, PG-1 couples SN to BL and the PG-2 couples SNB to BLB in response to voltage applied by WL to the gate terminals of PG-1 and PG-2, respectively. As provided herein, the various GAA NFETs (e.g., PG-1, PD-1, PG-2, and PD-2) each include a stack of the channel layers 105 having the width W1, and the various GAA PFETs (e.g., PU-1, IS-1, PU-2, and IS-2) each includes a stack of the channel layers 107 having the width W2, which is less than W1 as discussed in detail above.

Referring to FIG. 7B, BL, BLB, $V_{DD}$, $V_{SS}$, and WL are schematically illustrated as multiple horizontal interconnect structures (also referred to as conductive lines) disposed over the SRAM array 100 as discussed above. For example, BL, BLB, and $V_{DD}$ are formed in the first metal layer M1, WL is formed in the second metal layer M2, and $V_{SS}$ is formed in the third metal layer M3. Additionally, the SRAM array 100 may further include vertical interconnect structures (also referred to as vias) to electrically connect various GAA FETs with a suitable metal layer and/or to electrically connect two metal layers together. For example, a via 126A may be configured to connect one of the device-level S/D contacts (e.g., the S/D contact 120A or 120D depicted in FIG. 7B) with the M1 (e.g., BL, $V_{DD}$, or BLB), a via 126B may be configured to connect the M1 with the M2, and a via 126C may be configured to connect the M2 (e.g., WL) with the M3 (e.g., $V_{SS}$). It is understood that gate and drain terminals of each of IS-1 and IS-2 are internally coupled at the device level below the MLI structure.

Now turning to the STD array 200, referring to FIG. 8, a portion of the STD array 200 are schematically depicted in a planar top view. It is noted that FIG. 8 has been simplified for the sake of clarity to better illustrate embodiments of the present disclosure. As such, additional features can be added to the STD array 200, and some of the features described below can be replaced, modified, or eliminated in other embodiments of the STD cells 201. Different from the SRAM array 100 depicted in FIG. 3, the STD array 200 may include a plurality of STD cells of varying sizes. For example, in the present embodiments, four STD cells 201A, 201B, 201C, and 201D are depicted; of which, the STD cells 201A and 201D have similar $S_x$ and $S_{y-1}$, and the STD cells 201B and 201C have similar $S_x$ and $S_{y-2}$, where $S_{y-2}$ is less than $S_{y-1}$. Of course, specific pitches of the STD cells 201A-201D may be adjusted based on specific design requirements. The STD cells 201A-201D may each include one or more p-type fin 206 each disposed in a p-type well 211 and one or more n-type fin 208 each disposed in an n-type well 210 interposing two p-type wells 211. In the depicted embodiments, the STD cells 201A-201D each includes one p-type fin 206 and one n-type fin 208, which are oriented lengthwise along the Y-axis. In some embodiments, a length of the p-type fin 206 in a first STD cell (e.g., the STD cell 201A) differs from a length of the p-type fin 206 in a second STD cell (e.g., the STD cell 201C), and a length of the n-type fin 208 in the first STD cell differs from a length of the n-type fin 208 in the second STD cell.

Each of the STD cells 201A-201D further includes one or more gate stacks, such as gate stacks 230A, 230B, and/or 230C, configured to engage with portions (i.e., the channel regions) of the p-type fins 206 to form GAA NFETs 202, and with portions (i.e., the channel regions) of the n-type fins 208 to form GAA PFETs 204. Adjacent gate stacks along the X-axis may be separated by gate isolation features 238, which are similar in function (and/or composition) as the gate isolation features 138 of the SRAM cell 101. Referring to FIGS. 9A, 9B, and 11, the gate stacks 230A-230C may be high-k metal gate structures (similar to the gate stacks 130A-130D of the SRAM cell 101) and thus each include at least a high-k gate dielectric layer 232 disposed over a channel region of each GAA FET and a metal gate electrode 234 disposed over the high-k gate dielectric layer 232. Though not depicted, the metal gate electrode 234 may include a bulk conductive layer disposed over at least one work function metal layer. Furthermore, each gate stack 230A-230C may include gate spacers 216 (top gate spacers 216A are shown in FIG. 8 and inner spacers are shown in FIG. 11) disposed on its sidewalls. Portions of the gate stacks 230A-230C may be electrically coupled to components of the subsequently-formed MLI structure by gate contacts 222, which are similar to the gate contacts 122 of the SRAM cell 101 as discussed above.

In the present embodiments, the p-type fins 206 and the n-type fins 208 do not extend continuously along the Y-axis across two adjacent STD cells. In other words, the p-type fins 206 and the n-type fins 208 of each STD cells 201A-201D are truncated by the dielectric gate structures 240A at cell boundaries (dotted line) along the X-axis. In the present embodiments, the dielectric (i.e., generally electrically non-conductive) gate structures 240A are oriented lengthwise along the X-axis, i.e., generally parallel to the gate stacks 230A-230C, which are metal (i.e., electrically conductive) gate stacks. In some embodiments, the dielectric gate structures 240A may include structures known as continuous poly on diffusion edge (or CPODE), which may be implemented to reduce a gate pitch between adjacent gate stacks 230A-230C. The dielectric gate structures 240A may be formed prior to or following a gate replacement process (e.g., a gate-last process discussed in detail below).

Referring collectively to FIGS. 8, 9A, and 9B, the STD array 200 is formed over the substrate 12 as a portion of the IC structure 10 with various doped regions (i.e., the p-wells 211 and the n-wells 210) being separated by the isolation structures 14. In the present embodiments, each p-type fin 206 formed in the p-well 211 includes a stack of semiconductor layers 207 disposed over a base fin 203, and each n-type fin 208 formed in the n-well 210 includes a stack of semiconductor layers 209 disposed over a base fin 205. The semiconductor layers 207 and 209 may be arranged in a similar configuration as the channel layers 105 and 107 of the SRAM cell 101 as discussed above. For example, in the present embodiments, the semiconductor layers 207 and 209 are generally oriented lengthwise along the Y-axis and stacked vertically along the Z-axis. Additionally, each stack of the semiconductor layers 207 interposes between n-type S/D features 214N formed over the base fin 203, and each stack of the semiconductor layers 209 interposes between p-type S/D features 214P formed over the base fin 205. Furthermore, the semiconductor layers 207 are suspended in (or wrapped around by) one of the gate stacks 230A-230C (e.g., the gate stack 230A) to form a GAA NFET 202, and the semiconductor layers 209 are suspended in (or wrapped around by) one of the gate stacks 230A-230C (e.g., the gate stack 230A) to form a GAA PFET 204. In other words, each stack of the semiconductor layers 207 engages with a portion of the gate stack 230A-230C to form a channel region of a GAA NFET 202, while each stack of the semiconductor layers 209 engages with a portion of the gate stack 230A-230C to form a channel region of a GAA PFET 204. As such, the semiconductor layers 207 are hereafter referred to as channel layers 207 and the semiconductor layers 209 are hereafter referred to as channel layers 209 for purposes of clarity. Furthermore, an ESL 233, similar to the ESL 133 as discussed above with respect to the SRAM cells 101, may be disposed over the gate stacks 230A-230C to protect components of the STD cells 201A-201D during subsequently fabrication process.

In some embodiments, composition of the channel layers 207 and 209 may be substantially the same to that of the channel layers 105 and 107 and may include Si in the form of a nanosheet, a nanowire, a nanorod, or any other configurations suitable for forming a GAA FET. In some examples, the p-type fin 206 and the n-type fin 208 may each include two to ten channel layers 207 and 209, respectively; though the present embodiments are not limited to such configurations and the number of semiconductor layers may be tuned according to design requirements for the IC structure 10. Each stack of the channel layers 207 may be defined by a width W3, a layer thickness T3, and a layer separation distance S3, all of which are defined similarly as those of the channel layers 105 and 107. Similarly, each stack of the channel layers 209 may be defined by a width W4, a layer thickness T4, and a layer separation distance S4. In the present embodiments, T3 is substantially the same as T4 and S3 is substantially the same as S4. In some embodiments, referring to FIG. 9A, W3 is substantially the same as W4. As discussed above, "substantially the same" in the present embodiments generally indicates a difference between two values within about ±5%. Accordingly, W3 and W4 may be within 5% in magnitude. In some embodiments, referring to FIG. 9B, W3 is less than W4. For example, a ratio of W4 to W3 may be about 1.1 to about 2, i.e., W4 is greater than W3 by at least about 10% of W3. In some examples, W3 may be about 10 nm to about 60 nm and W4 may be about 10 nm to about 70 nm.

As discussed above, carrier mobility in a GAA NFET is generally greater than carrier mobility in a GAA PFET, especially along the stacking direction of the channel layers. Thus, in order to increase $I_{on}$ of a GAA NFET relative to $I_{on}$ of a GAA PFET in the SRAM cell 101, it may be desirable to increase the ratio of W1, which is the layer width of the channel layers 105 in a GAA NFET (e.g., PD-1, PD-2, PG-1, or PG-2), to W2, which is the layer width of the channel layers 107 in a GAA PFET (e.g., PU-1 or PU-2). For example, in the present embodiments, the ratio of W1 to W2 is about 1.1 to about 4, i.e., W1 is greater than W2 by at least about 10% of W2. In the STD cell 201A-201D, however, it may be more desirable for the performance of the GAA NFETs 202 to be balanced with the performance of the GAA PFETs 204 by tuning W3 to be less than or substantially the same as W4. In this regard, the ratio of W4 to W3 may be less than the ratio of W1 to W2 to maintain such balance.

Now referring collectively to FIGS. 8 and 10, each gate stack 230A-230C (and its corresponding channel region) interposes two p-type S/D features 214P or two n-type S/D features 214N, depending upon the conductivity type of the underlying fin structure. The STD cells 201A-201D may further include various S/D contacts 220A, 220B, 220C, 220D, and 220E oriented lengthwise along the X-axis. Each S/D contact 220A-220E may be disposed over and physically contact one or more p-type S/D feature 214P or one or more n-type S/D feature 214N. For example, the S/D contacts 220A and 220B are disposed over at least one n-type S/D feature 214N, and the S/D contacts 220C, 220D, and 220E are disposed over at least one p-type S/D feature 214P. In some embodiments, the S/D contacts 220A-220E differ in length along the X-axis. For example, the S/D contact 220E is longer than the S/D contact 220C, which is longer than the S/D contact 220D. Each STD cell 201A-201D may be coupled to various vertical interconnect structures, such as vias 226A and vias 226B, configured to interconnect the S/D contacts 220A-220E to features of the MLI structure similar to the vias 126A of the SRAM cell 101 as discussed above.

Referring to FIG. 11, further details of the STD cells 201A-201D are depicted in a cross-sectional view of FIG. 8 taken along line CC' (e.g., lengthwise through one of the n-type fins 208) across the STD cells 201A and 201C along the Y-axis. As depicted herein, each gate stack 230A-230C may include similar components as the gate stacks 130A-130D in the SRAM cells 101. For example, each gate stack 230A-230C is disposed between two S/D features (214N or 214P) and includes an upper portion disposed above a topmost channel layer (207 or 209) and a lower portion that wraps around the plurality of the channel layers (207 or 209). The gate spacers 216 may include top spacers 216A and inner spacers 216B arranged in a similar configuration as the top spacers 116A and the inner spacers 116B as discussed above. Similar to the structure of the SRAM cell 101, each STD cell 201A-201D may further include a silicide layer 223 disposed between each of the S/D features 214P and 214N and their respective S/D contacts 220A-

220E, an ESL 233 disposed over the gate stacks 230A-230C, and the ILD layer 20 disposed over the ESL 233. Still referring to FIG. 11, the dielectric gate structures 240A are disposed at cell boundaries between two adjacent STD cells along the X-axis, thereby truncating the p-type fins 206 and n-type fin 208. In the present embodiments, the dielectric gate structures 240A generally extend along the Y-axis to below a bottom surface of the gate stacks 230A-230C, i.e., to below a top surface of the isolation structures 14.

In some embodiments, referring collectively to FIGS. 12 and 13, the STD array 200 includes p-type fins 206 and n-type fins 208 extending continuously through at least two adjacent STD cells (e.g., through the STD cells 201A and 201C or through the STD cells 201B and 201D) across cell boundaries along the X-axis. Similar to the isolation transistors IS-1 and IS-2 of the SRAM cells 101 discussed above, continuous fin structures in the STD cells 201A-201D may benefit from the use of n-type isolation transistors 212 and p-type isolation transistor 213 disposed at the cell boundaries. In the present embodiments, the n-type isolation transistors 212 and the p-type isolation transistors 213 are formed by the isolation gate structures 240B engaging with the channel regions of the p-type fins 206 and the n-type fins 208, respectively. As discussed above, the channel region of the p-type fins 206 are configured to include the stack of channel layers 207 having a layer width of W3 and the channel region of the n-type fins 208 are configured to include the stack of channel layers 209 having a layer width of W4. In some embodiments, adjacent isolation gate structures 240B, which may be conductive gate stacks similar to the gate stacks 230A-230C, are separated by gate isolation features 238. Furthermore, via the gate contacts 222, the gate terminal of each n-type isolation transistor 212 is electrically connected to $V_{DD}$ and the gate terminal of each p-type isolation transistor 213 is electrically connected to $V_{SS}$. In the present embodiments, the isolation transistors 212 and 213 are configurated to have minimal or negligible effect on the STD cells 201A-201D during operation. It is understood that other components of the STD array 200 depicted in FIGS. 12 and 13 are consistent with those depicted in FIGS. 8-11. Accordingly, a detailed account of these components is not repeated for purposes of simplicity.

Figure 14:
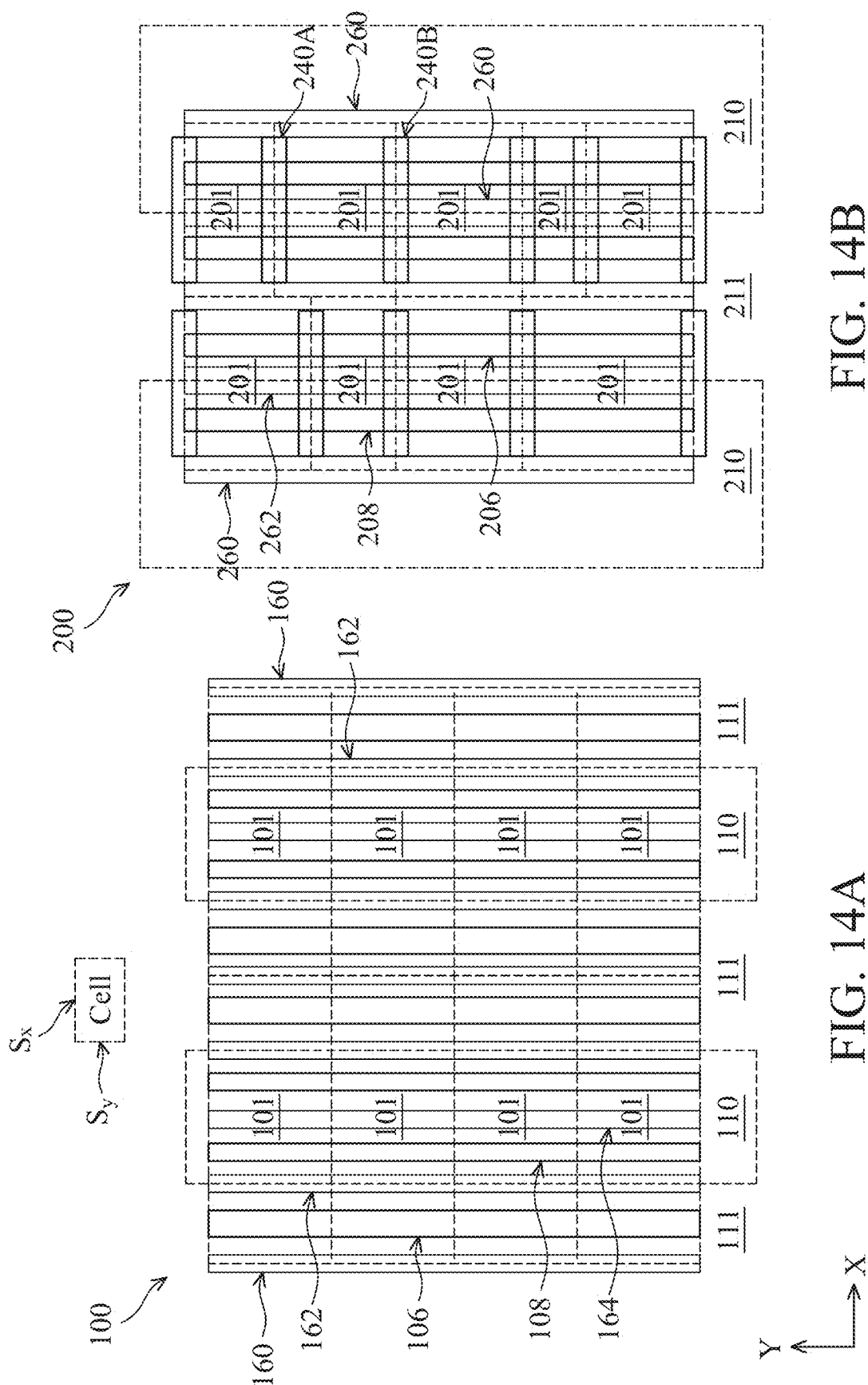

In some embodiments of the present disclosure, collectively referring to FIGS. 14A-19, the IC structure 10 further includes a plurality of dielectric fins disposed in the SRAM cells and/or the STD cells provided herein. For example, FIGS. 14A and 14B depict embodiments of the SRAM array 100 and the STD array 200 in planar top views that are similar to those depicted in FIGS. 2A and 2B, respectively, with the exception of the presence of dielectric fins 160, 162, and 164 in the SRAM array 100 and dielectric fins 260 and 262 in the STD array 200.

Figure 15:
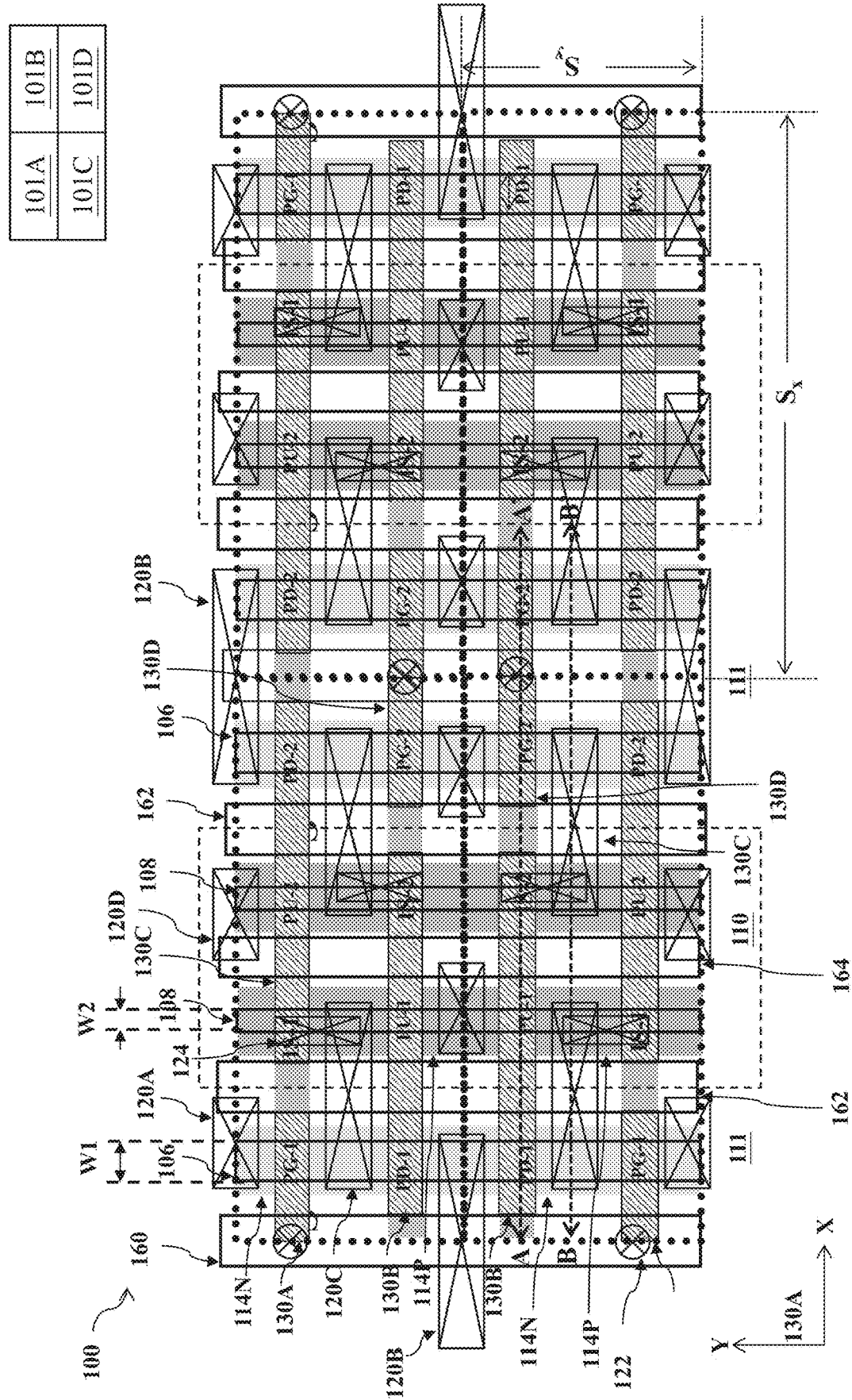
Figure 16:
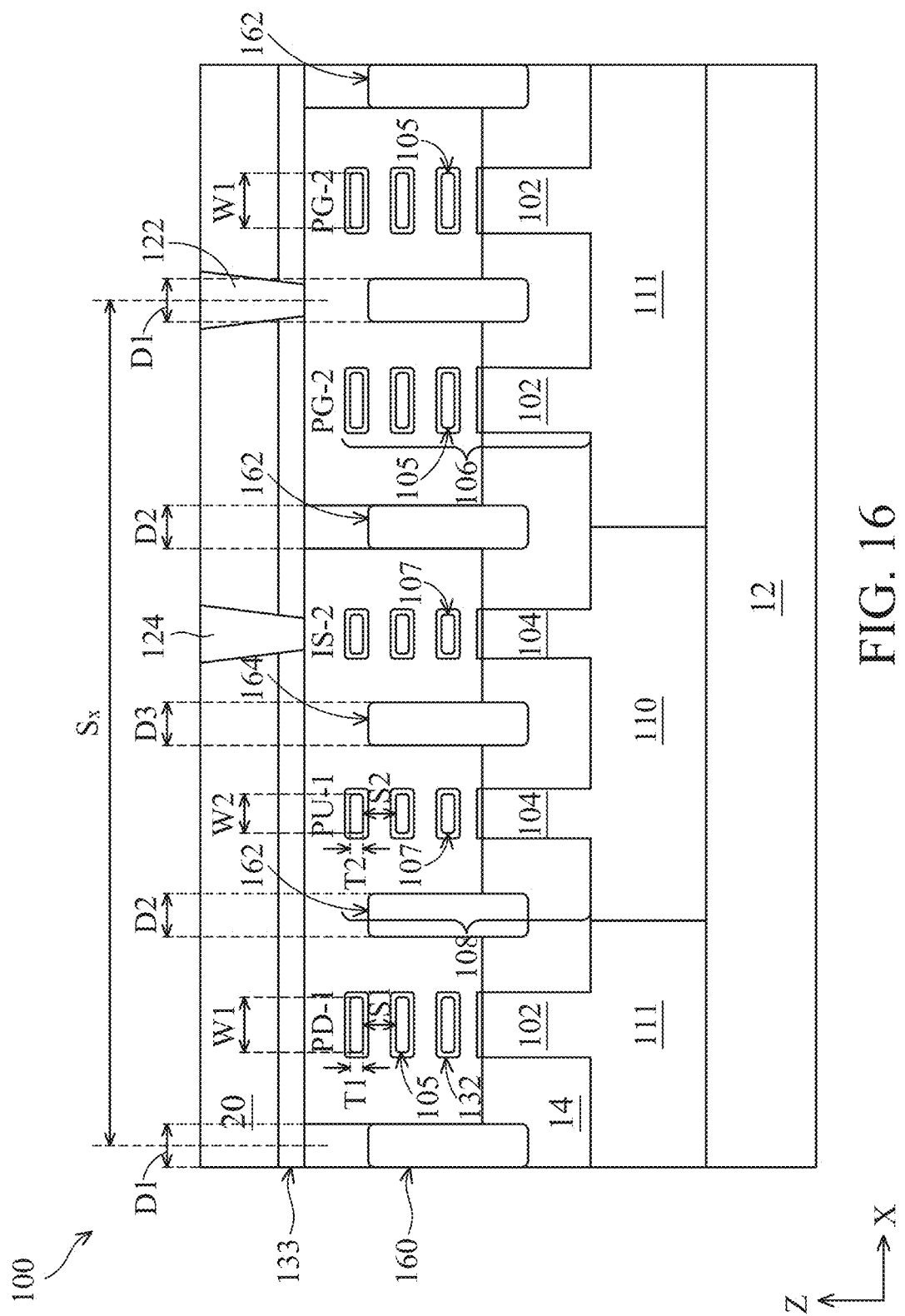
Figure 17:
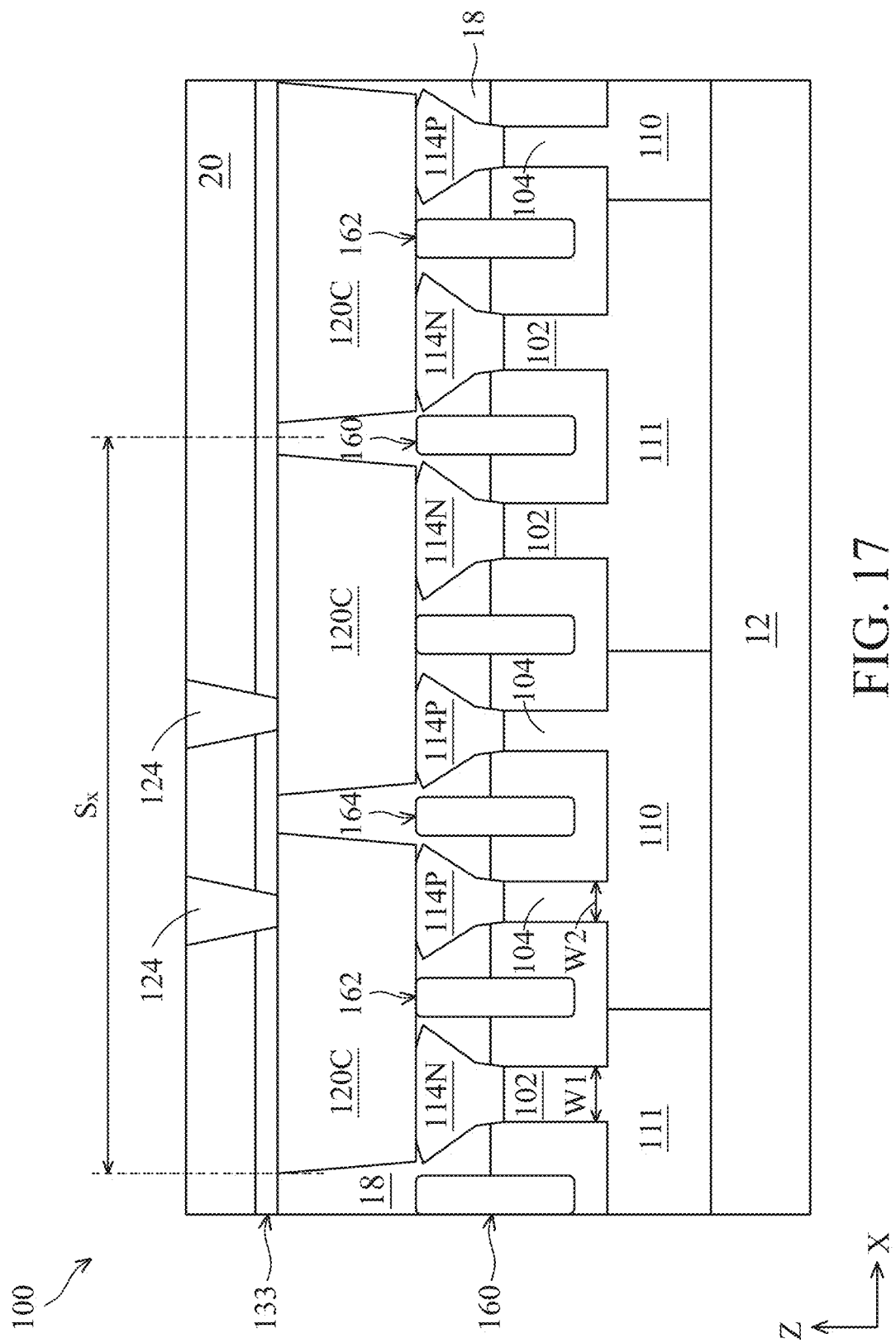
Figure 18:
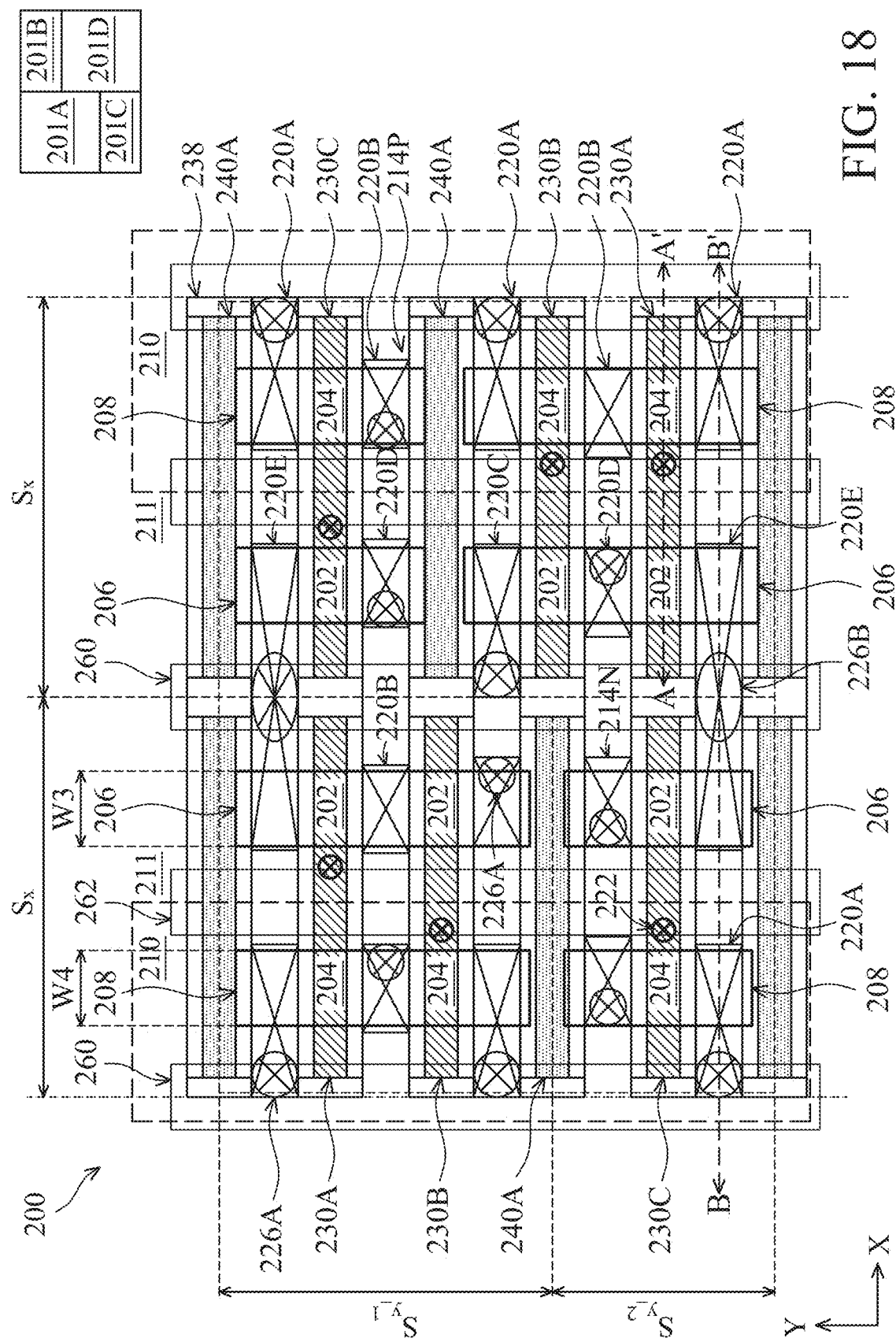
Figure 19:
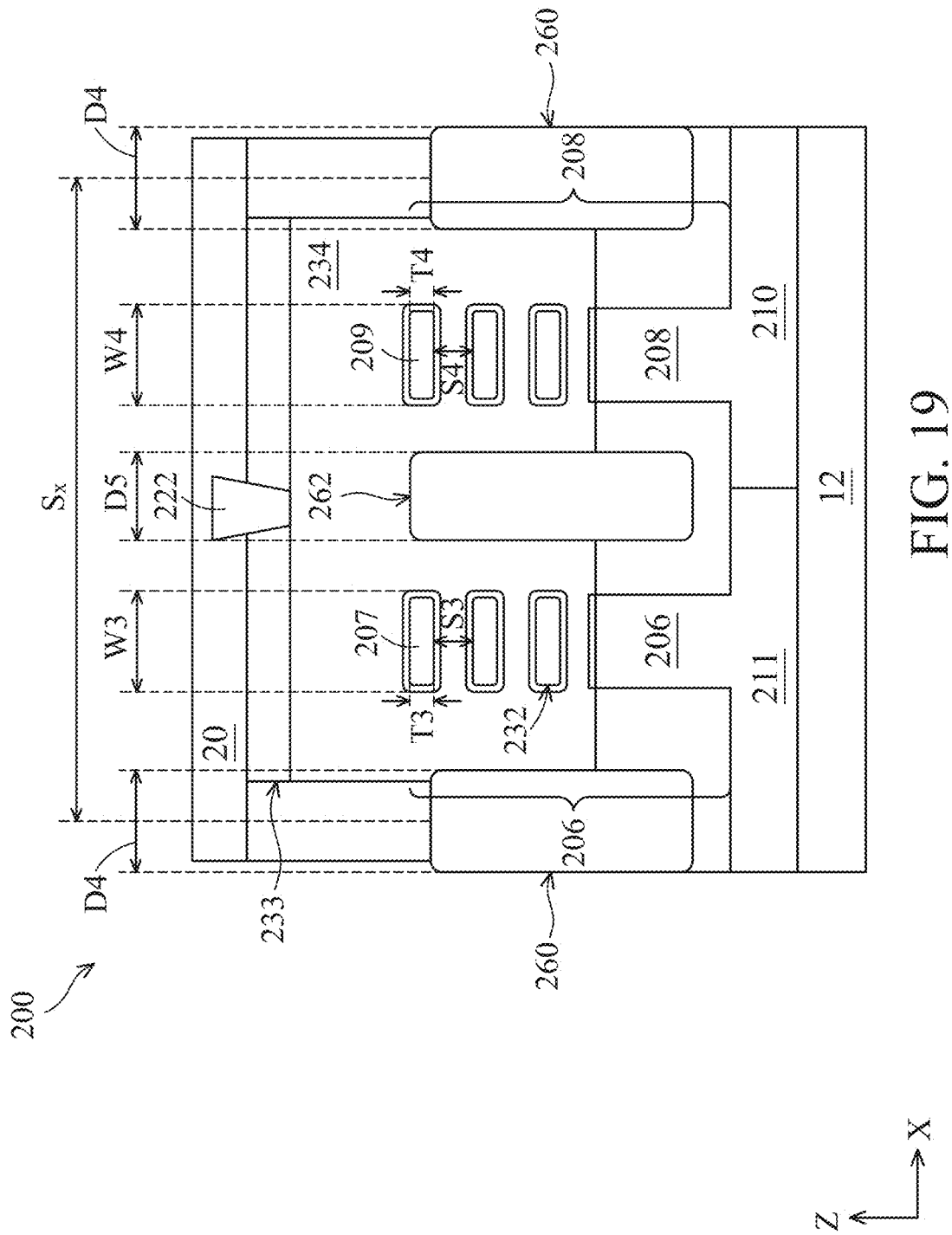

Embodiments of the SRAM array 100 having the dielectric fins 160-164 are discussed in detail below with reference to FIGS. 15-17, and embodiments of the STD array 200 having the dielectric fins 260 and 262 are discussed in detail below with reference to FIGS. 18 and 19. It is noted that components of the SRAM array 100 depicted in FIGS. 15-17 are consistent with those depicted in FIGS. 3-7, and components of the STD array 200 depicted in FIGS. 18 and 19 are consistent with those depicted in FIGS. 8-11. Accordingly, a detailed account of these components is not repeated with reference to FIGS. 14A-19 for purposes of clarity.

Referring to FIGS. 14A and 15, the dielectric fins 160-164 are generally oriented lengthwise along the Y-axis (i.e., substantially parallel to lengthwise direction of the p-type fins 106 and the n-type fins 108) and are spaced from each along the X-axis in the SRAM array 100. In the present embodiments, the dielectric fins 160-164 extend through at least two adjacent SRAM cells 101 along the Y-axis. Along the X-axis, each dielectric fin 160 is disposed between two p-type fins 106, each dielectric fin 162 is disposed between a p-type fin 106 and an n-type fin 108, and each dielectric fin 164 is disposed between two n-type fins 108. In other words, the dielectric fins 160-164 are intermixed with the p-type fins 106 and the n-type fins 108 along the X-axis. In the depicted embodiments, the dielectric fins 160 are disposed at cell boundaries, and the dielectric fins 162 and 164 are disposed within the cell boundaries. In furtherance to the depicted embodiments, each SRAM cell 101 includes two dielectric fins 162 and one dielectric fin 164, while sharing each dielectric fin 160 with an adjacent SRAM cell 101. Of course, the present embodiments are not limited to such configurations and may include more or less number of dielectric fins according to various design requirements.

Referring to FIG. 16, which depicts a cross-sectional view of the SRAM array 100 in FIG. 15 along line AA', each dielectric fin 160 may be defined by a width D1, each dielectric fin 162 may be defined by a width D2, and each dielectric fin 164 may be defined by a width D3. In some embodiments, D1, D2, and D3 are substantially the same (i.e., having a difference within about ±5%) in magnitude. In some embodiments, D1, D2, and D3 are different (i.e., having a difference of about >5%) in magnitude. In one such example, D1 may be greater than D2, which may be greater than D3. In some embodiments, the widths D1, D2, and D3 are adjusted to accommodate growth of S/D features (e.g., the n-type S/D features 114N and the p-type S/D features 114P) on each side of the dielectric fins 160-164, such that the sizes of the S/D features may be maximized without causing bridging issues in the SRAM cell 101 or substantially enlarging the overall dimension of the SRAM cells 101. In some examples, D1, D2, and D3 may each be about 4 nm to about 20 nm; of course, other suitable dimensions may also be applicable so long as the dielectric fins 160-164 ensure proper performance of the SRAM cells 101.

Referring to FIG. 17, which depicts a cross-sectional view of the SRAM array 100 in FIG. 15 taken along line BB', portions of the S/D contacts 120A-120D (e.g., the S/D contacts 120C depicted in FIG. 17) may physically contact a top surface of one or more of the dielectric fins 160-164 disposed between two adjacent S/D features (e.g., the n-type S/D features 114N and the p-type S/D features 114P). In some embodiments, the dielectric fins 160-164 are configured to prevent inadvertent bridging between adjacent S/D features, thereby eliminating electrical shorting in the GAA FETs. Additionally, the dielectric fins 160-164 may enlarge a landing area of the S/D contacts 120A-120D over the n-type S/D features 114N and the p-type S/D features 114P, thereby improving the performance of the GAA FETs.

Referring to FIG. 18, the dielectric fins 260 and 262 are generally oriented lengthwise along the Y-axis (i.e., substantially parallel to lengthwise direction of the p-type fins 206 and the n-type fins 208) and are spaced from each along the X-axis in the STD array 200. In the present embodiments, the dielectric fins 260 and 262 extend through at least two adjacent STD cells (e.g., the STD cells 201A and 201C or the STD cells 201B and 201D) along the Y-axis. Along the X-axis, each dielectric fin 260 is disposed between two n-type fins 208 or two p-type fins 206, and each dielectric fin 262 is disposed between a p-type fin 206 and an n-type fin 208. In other words, the dielectric fins 260 and 262 are intermixed with the n-type fins 208 and the p-type fins 206 along the X-axis. In the depicted embodiments, the dielectric fins 260 are disposed at cell boundaries, and the dielectric fins 262 are disposed within the cell boundaries. In furtherance to the depicted embodiments, each STD cell 201A-201D includes one dielectric fin 262 and share each dielectric fin 260 with an adjacent STD cell 201A-201D. Of course, the present embodiments are not limited to such configurations and may include more or less number of dielectric fins according to various design requirements.

Referring to FIG. 19, which depicts a cross-sectional view of the STD array 200 in FIG. 18 taken along line AA', each dielectric fin 260 may be defined by a width D4, and each dielectric fin 262 may be defined by a width D5. In some embodiments, D4 and D5 are substantially the same (i.e., having a difference within about ±5%) in magnitude. In some embodiments, D4 and D5 differ in magnitude of about >5%. In one such example, D4 may be greater than D5. In some embodiments, similar to the discussion above with respect to the widths D1, D2, and D3 in the SRAM cells 101, the widths D4 and D5 are adjusted to accommodate growth of S/D features (e.g., the n-type S/D features 214N and the p-type S/D features 214P) on each side of the dielectric fins 260 and 262. For example, the dielectric fins 260 and 262 may allow the S/D features to maximize their growth without substantially enlarging the overall dimension of the STD cells 201A-201D and/or causing shorting issues of the various GAA devices within the cell. In some embodiments, D4 is greater than D1 by at least about 10%, i.e., the dielectric fin 260 at a cell boundary of the STD cell 201A-201D is wider than the dielectric fin 160 at a cell boundary of the SRAM cell 101. In some examples, a ratio of D4 to D1 is about 1.1 to about 10. In some embodiments, the lesser of D4 and D5 is greater than the greatest of D1-D3 by at least about 10%, i.e., the dielectric fins 260 and 262 are generally wider than the dielectric fins 160-164. In some examples, D4 and D5 may each be about 6 nm to about 60 nm; of course, other suitable dimensions may also be applicable so long as the dielectric fins 260 and 262 ensure proper performance of the STD cells 201A-201D.

Figure 20:
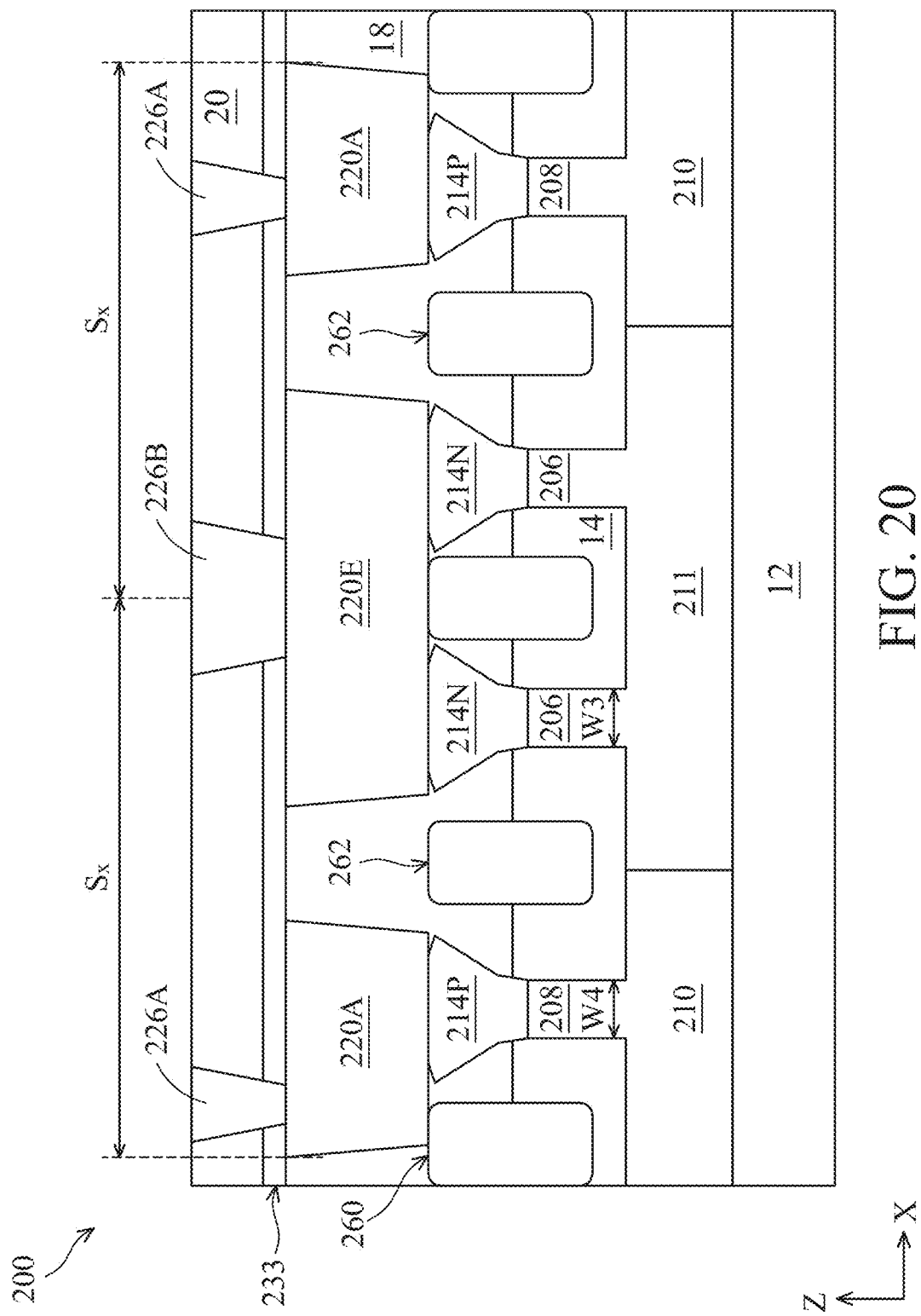

Referring to FIG. 20, which depicts a cross-sectional view of the STD array 200 in FIG. 18 taken along line BB', portions of the S/D contacts 220A-220E (e.g., the S/D contacts 220A and 220E are depicted in FIG. 20) may physically contact a top surface of one or more of the dielectric fins 260 and 262 disposed between two adjacent S/D features. In some embodiments, similar to the dielectric fins 160-164 discussed above, the dielectric fins 260 and 262 are configured to prevent inadvertent bridging between adjacent S/D features, thereby eliminating electrical shorting in the GAA FETs. Additionally, the dielectric fins 260 and 262 may enlarge a landing area of the S/D contacts 220A-220E over the n-type S/D features 214N and the p-type S/D features 214P, thereby improving the performance of the GAA FETs.

Figure 21:
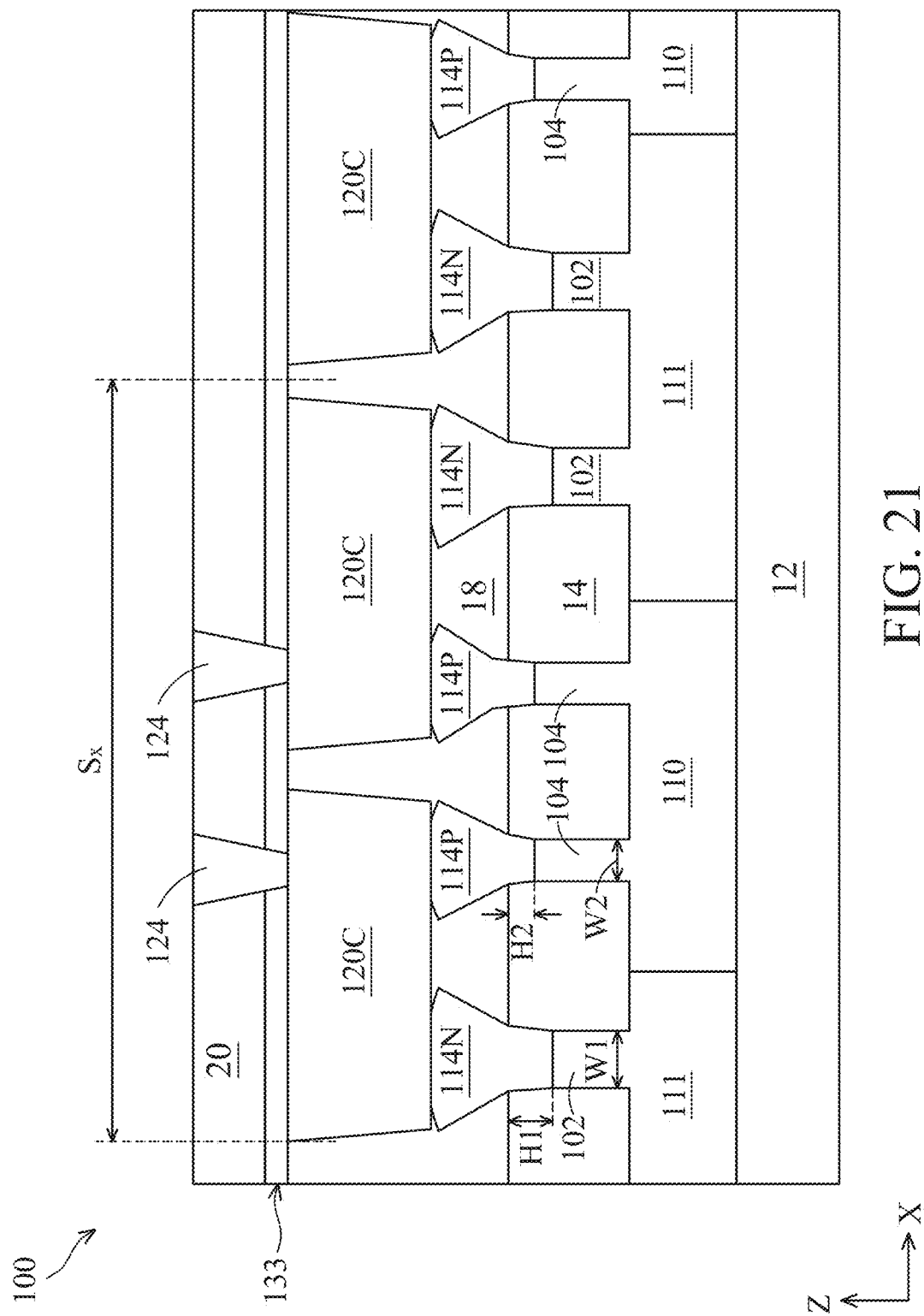
FIGS. 21, 22, and 23 are cross-sectional views of the IC structure along lines BB', CC', and DD', respectively, of FIG. 3, in portion or entirety, according to various aspects of the present disclosure.
Figure 22:
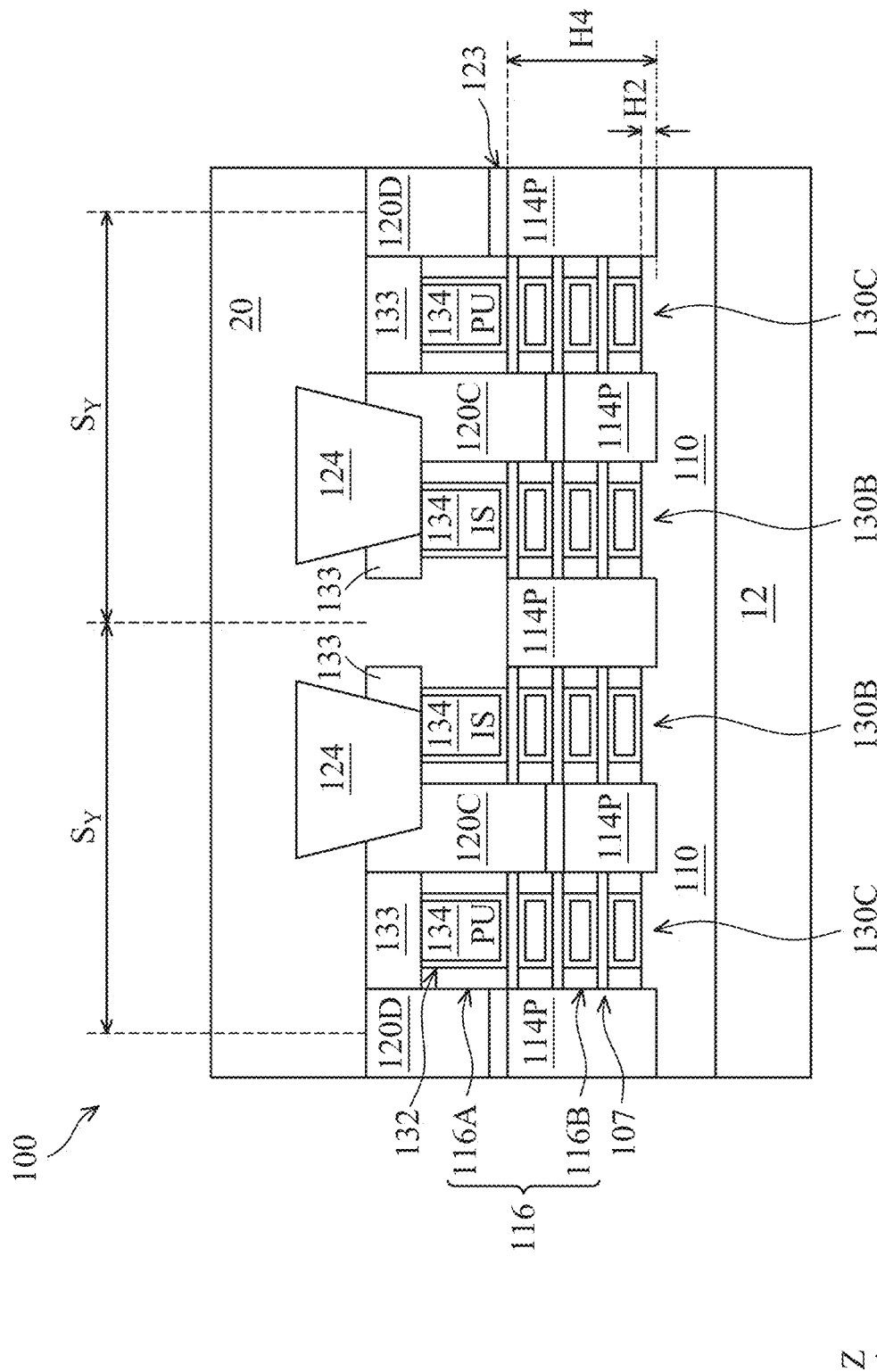
Figure 23:
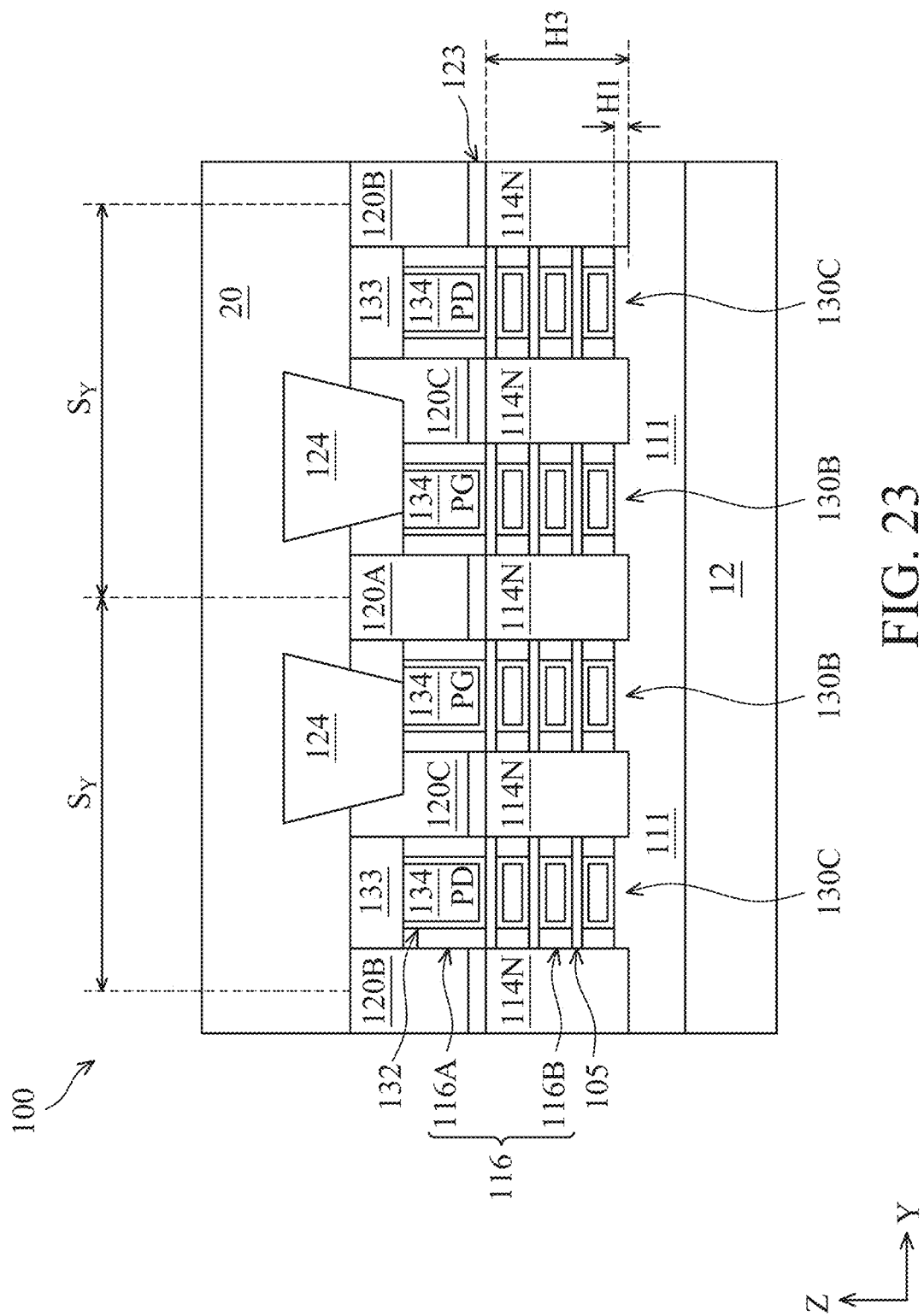

In some embodiments of the present disclosure, alternative or in addition to configuring the channel layers to different widths as discussed above, the n-type S/D features (e.g., 114N or 214N) and the p-type S/D features (e.g., 114P or 214P) may be fabricated to different configurations for improving performance of the GAA FETs in the SRAM array 100 or the STD array 200. Referring to FIG. 21, which depicts a cross-sectional view of the SRAM array 100 similar to that of FIG. 5 (through S/D regions), a depth H1 of the n-type S/D features 114N may be greater than a depth H2 of the p-type S/D features 114P, where H1 and H2 are measured from a top surface of the isolation structures 14. Referring to FIG. 22, which depicts a cross-sectional view of the SRAM array 100 similar to that of FIG. 6 (i.e., through an n-type fin 108), H4 defines height of a portion of the p-type S/D features 114P that engages with the channel region (i.e., the stack of channel layers 107) of each GAA PFET (e.g., PU-1, PU-2, IS-1, or IS-2) during device operation. Similarly, referring to FIG. 23, which depicts a cross-sectional view of the SRAM array 100 taken along line DD' in FIG. 3 (i.e., through a p-type fin 106), H3 defines a height of a portion of the n-type S/D features 114N that engages with the channel region (i.e., the stack of channel layers 105) of each GAA NFET (e.g., PD-1, PD-2, PG-1, or PG-2) during device operation. Accordingly, a current output of the GAA PFET (e.g., $I_{on}$_PU) as provided herein may be less than the current output of the GAA NFET (e.g., $I_{on}$_PG), thereby increasing a ratio of $I_{on}$_PG to $I_{on}$_PU, which may be desirable for improving the SRAM cell 101's processing speed as discussed in detail above.

Figure 24:
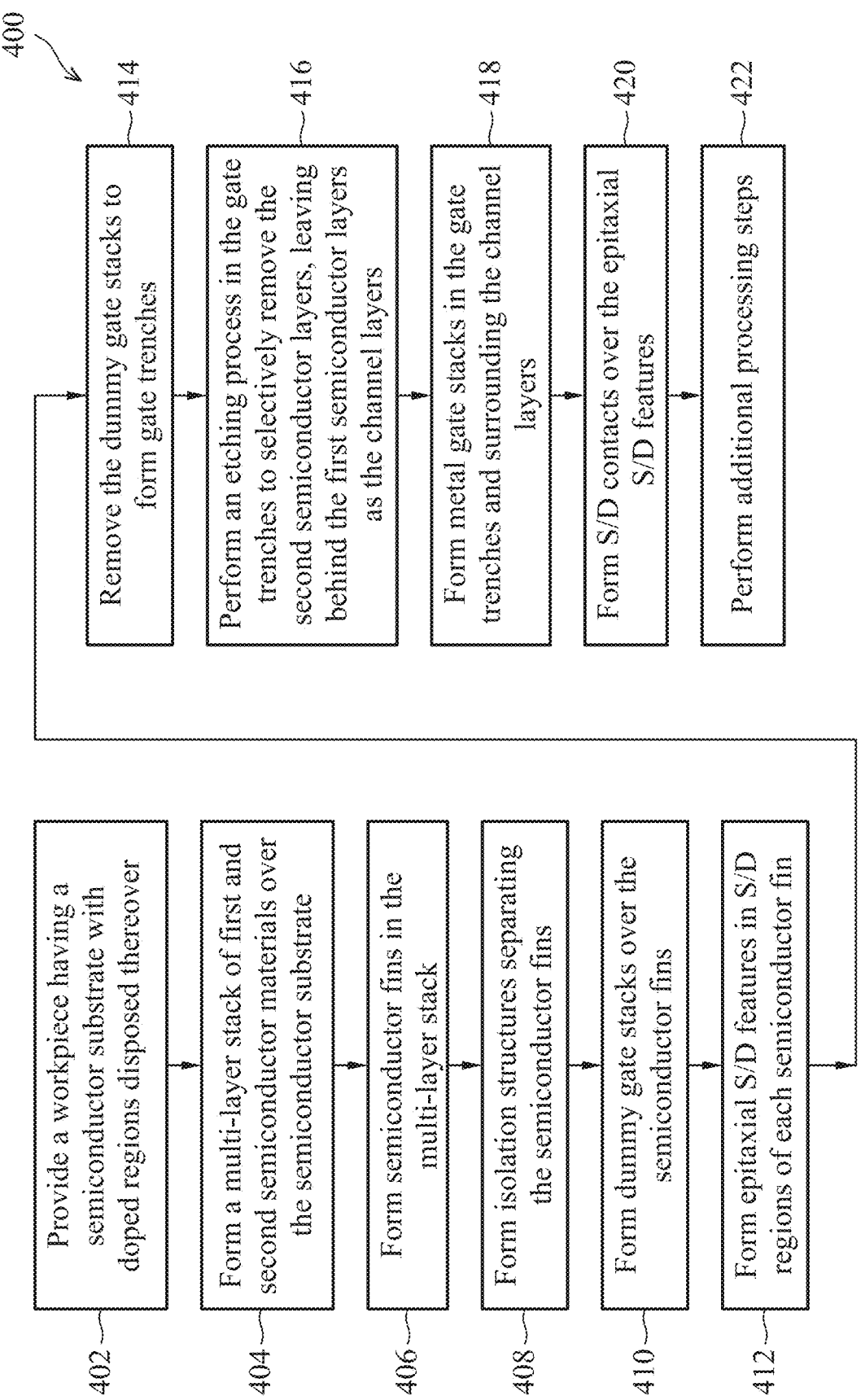
FIG. 24 is a flow chart of a method for fabricating an IC chip according to various aspects of the present disclosure.

FIG. 24 illustrates a processing flow of a method 400 for forming an embodiment of the IC structure 10 or portions thereof, such as the SRAM array 100 and/or the STD array 200 as depicted in FIGS. 2A-23 in accordance with some embodiments of the present disclosure. The method 400 is merely an example and is not intended to limit the present disclosure beyond what is explicitly recited in the claims. Additional operations can be performed before, during, and after the method 400, and some operations described can be replaced, eliminated, or moved around for additional embodiments of the method. After completing various operations of the method 400, multiple channels layers are formed over each doped region, stacked vertically, and surrounded by gate stacks to form various GAA FETs.

At operation 402, the method 400 provides a workpiece, such as the IC structure 10, that includes the substrate 12 and various doped regions (e.g., n-wells 110 and 210 and p-wells 111 and 211) formed in or over the substrate 12. In the present embodiments, the substrate 12 includes silicon. Alternatively or additionally, the substrate 12 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. In some embodiments, the substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, other suitable methods, or combinations thereof.

Each n-well may be doped with an n-type dopant, such as phosphorus, arsenic, other n-type dopants, or combinations thereof. Each p-well may be doped with a p-type dopant, such as boron, indium, other p-type dopants, or combinations thereof. In some embodiments, the substrate 12 includes doped regions formed with a combination of p-type dopants and n-type dopants. The various doped regions can be formed directly on and/or in the substrate 12, for example, providing a p-well structure, an n-well structure, a dual-well structure, a raised structure, or combinations thereof. Each of the various doped regions may be formed by performing an ion implantation process, a diffusion process, other suitable doping processes, or combinations thereof.

At operation 404, the method 400 forms a multi-layer stack of semiconductor materials (hereafter referred to as the "multi-layer stack" for short) over the substrate 12. In the present embodiments, the channel layers 105, 107, 207, and 209 are formed from the multi-layer stack at subsequent operations of the method 400. In some embodiments, the multi-layer stack includes alternating layers of a first semiconductor and a second semiconductor that is different from the first semiconductor. In the present embodiments, the first semiconductor layers are Si-containing layers and the second semiconductor layers are SiGe-containing layers.

In the present embodiments, the multi-layer stack includes alternating layers of epitaxial semiconductor materials (e.g., alternating layers of epitaxially grown S1 and epitaxially grown SiGe) grown in a series of epitaxy processes. The epitaxy process may include CVD deposition techniques (for example, vapor-phase epitaxy (VPE), ultra-high vacuum CVD (UHV-CVD), low-pressure CVD (LP-CVD), and/or plasma-enhanced CVD (PE-CVD)), molecular beam epitaxy, other suitable selective epitaxial growth (SEG) processes, or combinations thereof. The epitaxy process can use gaseous and/or liquid precursors, which interact with the composition of the underlying substrate. In some examples, the layers of the multi-stack may be provided in the form of nanosheets, nanowires, or nanorods. Subsequent processing may remove the second semiconductor layers (e.g., the SiGe-containing layers), leaving behind the first semiconductor layers (e.g., the Si-containing layers) in a suspending structure. Such a process, which will be discussed in detail below, may be referred to as the "wire release process" or "sheet formation process," depending upon the configuration of the layers in the multi-layer stack. In the present embodiments, the remaining stack of Si-containing semiconductor layers become the channel layers, such as the channel layers 105, 107, 207, and 209, configured to form a GAA NFET or a GAA PFET in the SRAM array 100 or the STD array 200.

At operation 406, the method 400 forms semiconductor fins (alternatively known as fin active regions), such as the p-type fins 106 and the n-type fins 108 of the SRAM cells 101 and the p-type fins 206 and the n-type fins 208 of the STD cells 201 (e.g., the STD cells 201A-201D), in the multi-layer stack. Accordingly, the semiconductor fins of the present embodiments include alternating layers of S1 and SiGe as discussed above with respect to the multi-layer stack. In some embodiments, the IC structure 10 includes semiconductor fins (not depicted herein) having a single semiconductor material rather than alternating layers of different semiconductor materials. The semiconductor fins may be fabricated by directly patterning the multi-layer stack. The fabrication process may include forming a masking element including a photoresist layer, lithographically patterning the masking element, and subsequently etching the multi-layer stack (and portions of the substrate 12) using the patterned masking element as an etch mask. The etching process may include dry etching, wet etching, reactive ion etching (RIE), other suitable processes, or combinations thereof. The resulting semiconductor fins may be doped with various dopants according to design requirements.

In the present embodiments, the various semiconductor fins within the SRAM cells 101 and the STD cells 201 are formed to different widths as discussed in detail above. With respect to the SRAM cells 101, for example, the p-type fins 106 are formed to the width W1 and the n-type fins 108 are formed the width W2, which may be less than W1 by at least about 10%. With respect to the STD cells 201, for example, the p-type fins 206 are formed to the width W3 and n-type fins 208 are formed to the width W4, which may be greater than or substantially the same as W3.

At operation 408, the method 400 forms the isolation structures 14 to insulate various components formed over the substrate 12. The isolation structures 14 may include STI, field oxide, LOCal oxidation of silicon (LOCOS), other suitable features comprising silicon oxide, silicon nitride, silicon oxynitride, other suitable dielectric materials, or combinations thereof. The isolation structures 14 may be formed by any suitable method. In some embodiments, the isolation structures 14 are formed by filling trenches between the semiconductor fins with a dielectric material, followed by applying a chemical mechanical planarization (CMP) process and an etch-back process to the dielectric material to form the isolation structures 14. The isolation structures 14 may include a multi-layer structure, for example, having one or more thermal oxide liner layers.

As discussed above, some embodiments of the IC structure 10 may include dielectric fins, such as the dielectric fins 160-164 in the SRAM cell 101 and the dielectric fins 260 and 262 in the STD cell 201, disposed between the semiconductor fins. The dielectric fins may each include a single dielectric material or multiple dielectric materials, such as silicon oxide, silicon oxycarbide, silicon oxycarbide nitride, silicon oxide with carbon contents, silicon oxide with nitrogen contents, a nitride based dielectric, a metal oxide based dielectric, hafnium oxide, tantalum oxide, titanium oxide, zirconium oxide, aluminum oxide, yttrium oxide, other suitable dielectric materials, or a combination thereof.

The dielectric fins may be formed by any suitable method. For example, the dielectric fins may be formed before forming the isolation structures 14, which are deposited as a spacer layer on the sidewalls of the semiconductor fins as discussed above. Before the spacer layer is recessed to be lower than the semiconductor fins to form the isolation structures 14, trenches are formed in the spacer layer by patterning and etching process(es). Thereafter, dielectric material(s) are deposited in the trenches using CVD, physical vapor deposition (PVD), atomic layer deposition (ALD), flowable CVD (FCVD), and/or other suitable methods, resulting in the dielectric fins. The spacer layer is then planarized (e.g., by one or more CMP processes) to expose a top surface of each of the semiconductor fins and the dielectric fins. Thereafter, the spacer layer is recessed or etched back (e.g., by a chemical etching process) to be lower than the top surface of each of the semiconductor fins and the dielectric fins, resulting in the isolation structures 14.

At operation 410, the method 400 forms one or more dummy gate stacks (not depicted) over the semiconductor fins (and the dielectric fins, if present). The dummy gate stacks may include, for example, an interfacial layer (including, for example, silicon oxide) and a dummy gate electrode layer (including, for example, polysilicon) formed over the interfacial layer. After forming other components (e.g., the S/D features 114N, 114P, 214N, and 214P), portions of each dummy gate stack (e.g., the dummy gate electrode layer) is removed to form a gate trench in which at least a high-k gate dielectric layer (e.g., the high-k gate dielectric layer 132 or 232) and a metal gate electrode (e.g., the metal gate electrode 134 and 234) are subsequently formed to complete the fabrication of each of the gate stacks 130A-130D and the gate stacks 230A-230C. Various material layers of the dummy gate stacks may be first deposited as a blanket layer over the semiconductor fins and subsequently patterned, followed by one or more etching process, to form the dummy gate stacks in a desired configuration in the SRAM cells 101 and the STD cells 201.

The top gate spacers of the GAA FETs, such as the top spacers 116A and 216A, may be formed on sidewalls of the dummy gate stacks at operation 410. The top spacers may include silicon nitride, silicon oxide, silicon carbide, silicon carbide nitride, silicon oxynitride, silicon oxycarbide, silicon oxycarbide nitride, a low-k dielectric material, other materials, or a combination thereof. The top spacers may be formed by first depositing a spacer layer over the dummy gate stacks and subsequently performing an anisotropic etching process to the spacer layer, leaving behind the top spacers on the sidewalls of the dummy gate stacks.

At operation 412, the method 400 forms various S/D features, such as the n-type S/D features 114N and 214N and the p-type S/D features 114P and 214P, in the S/D regions of each semiconductor fin. The n-type S/D features may include epitaxially grown semiconductor material(s) such as epitaxially grown S1 or SiC configured to form GAA NFETs, and may additionally include one or more n-type dopants, such as phosphorus or arsenic. The p-type S/D epitaxial features may include epitaxially grown semiconductor material(s) such as epitaxially grown SiGe configured to form GAA PFETs, and may additionally include one or more p-type dopants, such as boron or indium. Each S/D feature may include one or more epitaxially grown semiconductor layers. The n-type S/D features may be grown in p-type fins, such as the p-type fins 106 and 206, while the p-type S/D features may be grown in n-type fins, such as the n-type fins 108 and 208. Forming the S/D features may include removing portions of each semiconductor fin in its S/D regions to form an S/D recess and subsequently performing a suitable epitaxy process (discussed in detail above with reference to the multi-layer stack) to form the S/D features. In some embodiments, annealing processes are performed to activate dopants in the S/D features and/or other S/D regions, such as HDD regions and/or LDD regions.

In some embodiments, before forming the S/D features in the S/D recess, portions of the non-channel layers (e.g., the SiGe layers) of the multi-layer stack exposed in the S/D recess are selectively removed to form openings and a dielectric layer is subsequently deposited in the openings to form inner spacers, such as the inner spacers 116B and 216B. The inner spacers may include silicon nitride, silicon oxide, silicon carbide, silicon carbide nitride, silicon oxynitride, silicon oxycarbide, silicon oxycarbide nitride, a low-k dielectric material, other materials, or a combination thereof. The inner spacers may include a single-layered structure or a multi-layered structure. A composition of the inner spacers may be similar to or different from that of the top spacers, which has been discussed in detail above.

At operation 414, the method 400 removes the dummy gate stacks to form a plurality of gate trenches. Forming the gate trenches may include forming an ILD layer (e.g., ILD layer 18 depicted in FIGS. 5, 10, 17, 20, and 21) over the S/D features and the dummy gate stacks. The ILD layer may include any suitable dielectric material that is generally different from the composition of the ESL. For example, the ILD layer may include a low-k dielectric material, silicon oxide, doped silicate glass, other suitable materials, or combinations thereof, and may be formed by any suitable method, such as spin-on-glass or flowable CVD. A top surface of the ILD layer may be planarized using one or more CMP process.

At operation 416, the method 400 performs one or more etching process, such as a dry etching process and/or a wet etching process, to remove the non-channel layers (e.g., the SiGe layers) from the multi-layer stack, leaving behind the channel layers (e.g., the S1 layers) in a suspending structure. In other words, after removing the non-channel layers, multiple openings are inserted within the stack of channel layers. In the present embodiments, the one or more etching process selectively remove the non-channel layers without removing or substantially remove the channel layers. In one such example, the one or more etching process includes applying a fluorine-containing etching gas.

In contrast to FinFETs whose channel regions include single-layer fin structures, forming GAA NFETs and GAA PFETs to different widths in their respect channel regions introduces many challenges. For example, forming the suspending stack of channel layers, such as the channel layers 105, 107, 207, and 209, to different widths may lead to non-uniform etching of the multi-layer stack during the sheet release process. In some instances, the non-channel layers in the narrower stack (e.g., in the n-type fins 108 or the p-type fins 206) may be removed more readily than the non-channel layers in the wider stack (e.g., the p-type fins 106 or the n-type fins 208). As a result, in order to remove the non-channel layers of the wider stacks, the channel layers of the narrower stacks may be inadvertently etched. Accordingly, the ratios of W1 to W2 and of W4 to W3 as discussed in detail above may be tuned to ensure that the inadvertent damage to the channel layers of the narrower stacks be kept at an acceptable level to maintain proper performance of the IC structure 10. For example, while ratios of W1 to W2 greater than about 4 may be applicable to some embodiments of the present disclosure, tuning the ratio to be between about 1.1 to about 4 ensures that the extent of inadvertent etching of the channel layers 107 be controlled within the general IC design requirements. Similarly, the ratio of W4 to W3 may be tuned to about 1.1 to about 2 to ensure that the extent of inadvertent etching of the channel layers 207 be maintained at an acceptable level. Alternatively or additionally, the inadvertent damage to the channel layers may be mitigated by tuning the etching conditions (e.g., duration of the etching process, choice of the etchant, pressure of the etchant, etc.) of the sheet release process.

At operation 418, the method 400 forms the gate stacks (e.g., the gate stacks 130A-130D, the gate stacks 230A-230C, and the isolation gate structures 240B) in the gate trenches as well as the openings formed between the channel layers. In the present embodiments, each gate stack includes at least a high-k gate dielectric layer (e.g., the high-k gate dielectric layer 132 and 232) and a metal gate electrode (e.g., the metal gate electrode 134 and 234). In the present embodiments, portions of the high-k gate dielectric layer 132 wrap around each channel layer, such that the gate stack engages with the plurality of channel layers in each GAA FET. The high-k gate dielectric layer may include silicon oxide, silicon oxynitride, aluminum silicon oxide, a high-k dielectric material such as hafnium oxide, zirconium oxide, lanthanum oxide, titanium oxide, yttrium oxide, strontium titanate, other suitable dielectric materials, or combinations thereof. Though not depicted, each metal gate electrode may further include a bulk conductive layer disposed over at least one work function metal layer. The bulk conductive layer may include Cu, W, Ru, Co, Al, other suitable metals, or combinations thereof. In some examples, each gate stack may include one or more work function metal layer of the same conductivity type or of different conductivity types. Examples of the work function metal layers may include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. Various work function metal layers may be first deposited and then patterned to satisfy different requirements of threshold voltage in different GAA FETs. Additional material layers may also be included in each gate stack, such as an interfacial layer, a barrier layer, a capping layer, other suitable materials layers, or combinations thereof. Various layers of the gate stacks may be deposited by any suitable method, such as chemical oxidation, thermal oxidation, ALD, CVD, PVD, plating, other suitable methods, or combinations thereof.

In some embodiments, the dielectric gate structures 240A disposed at some of the boundaries of the STD cells 201 (see FIGS. 8 and 18) include dielectric gate structures not configured to provide any functional devices. The dielectric gate structures 240A may include a single-layered structure or a multi-layered structure having one or more dielectric material, such as silicon oxide, silicon nitride, silicon carbide, silicon oxynitride, a low-k dielectric material, other suitable dielectric materials, or combinations thereof. In the present embodiments, the dielectric gate structures are formed by removing portions of the dummy gate stacks to form gate trenches at operation 414 and subsequently depositing the one or more dielectric material discussed above in the gate trenches before or after forming the gate stacks (e.g., the gate stacks 130A-130D and the gate stacks 230A-230C) at operation 418.

In some embodiments, the dielectric fins (e.g., the dielectric fins 160-164, 260, and 262) may benefit the fabrication of the various conductive (or functional) gate stacks. For example, because patterning work function metal layers as discussed above may include isotropically etching portions of a work function metal layer disposed between a stack of channel layers, the work function metal layer disposed between a neighboring stack of channel layers may be inadvertently etched. The presence of the dielectric lines between various semiconductor fins (i.e., stacks of channel layers) may thus function as "blocking layers" for preventing one or more work function metal layers from being unintentionally etched during such a patterning process.

At operation 420, the method 400 forms the S/D contacts (e.g., the S/D contacts 120A-120D and 220A-220E) to interconnect various S/D features with the subsequently-formed MLI structures. In the present embodiments, the S/D contacts are disposed in the ILD layer, such as the ILD layer 20. The S/D contacts may include any suitable conductive material, such as Cu, W, Ru, Co, Al, other suitable metals, or combinations thereof. Each S/D contact may further include a barrier layer comprising any suitable material, such as Ti, Ta, TiN, and/or TaN. Forming the S/D contacts may include implementing lithography processes and/or etching processes to form openings (trenches), such as contact openings, in the ILD layer. Thereafter, the opening(s) are filled with one or more conductive materials by PVD, CVD, ALD, plating, other suitable deposition processes, or combinations thereof. Thereafter, any excess conductive material(s) may be removed by a CMP process, thereby planarizing a top surface of ILD layer and a top surface of the S/D contacts.

In some embodiments, a silicide layer (e.g., the silicide layer 123 and 223), is formed over the S/D features in the contact opening before forming the S/D contacts. The silicide layer may be formed by first depositing a metal layer over the S/D features, performing an annealing process to allow the metal layer to react with the materials of the S/D features, and subsequently removing un-reacted portions of the metal layer to leave behind the silicide layer. The silicide layer may include nickel silicide, titanium silicide, cobalt silicide, other suitable silicides, or combinations thereof.

At operation 422, the method 400 performs additional processing steps including, for example, forming the MLI structure over the IC structure 10. As provided herein, the MLI structure may include a plurality of conductive features configured to interconnect various devices (e.g., GAA FETs, other transistors, resistors, capacitors, and/or inductors, etc.) and/or components (e.g., gate stacks, S/D features, etc.) of the SRAM cells 101 and the STD cells 201 with additional devices and components to ensure the proper performance of the IC structure 10. The MLI structure may include various electrically conductive layers and dielectric layers (e.g., the ILD layer 20 and the ESL 133) configured to form various interconnect structures. The conductive layers are configured to form vertical interconnect features, such as vertical interconnect structures (e.g., the vias 126A-126C, 226A, and 226B) and/or horizontal interconnect structures (e.g., conductive lines). Each horizontal interconnect feature disposed in a dielectric layer may be referred to as a "metal layer," and two different metal layers may be electrically coupled by one or more vertical interconnect structures. In some embodiments, an ESL is formed between metal layers to accommodate fabrication of various interconnect structures. Each interconnect structure may include Cu, W, Ru, Co, Al, other suitable metals, or combinations thereof, and may further include a barrier layer comprising Ti, Ta, TiN, and/or TaN. Each dielectric layer may include a low-k dielectric material, silicon oxide, other suitable dielectric materials, or combinations thereof, and may be formed by spin-on-glass, FCVD, other suitable methods, or combinations thereof. Methods of forming the various interconnect structures may be similar to that of forming the S/D contacts as discussed above.

Although not intended to be limiting, one or more embodiments of the present disclosure provide many benefits to a semiconductor device and the formation thereof. For example, the present embodiments provide an array of memory cells, such as SRAM cells, and an array of standard logic cells, or STD cells, in the same IC structure, where the memory and STD cells each include at least one GAA NFET and at least one GAA PFET, each of the GAA FETs including a gate structure (e.g., a high-k metal gate structure) configured to engage with a stack of channel layers. In some embodiments of the SRAM cells, a width W1 of the stack of channel layers in the GAA NFET is greater than a width W2 of the stack of channel layers in the GAA PFET. In some embodiments of the STD cells, a width W3 of the stack of channel layers in the GAA NFET is less than a width W4 of the stack of channel layers in the GAA PFET. In some embodiments of the STD cells, W3 is substantially the same as W4. In some embodiments, ratios of W1 to W2 and of W4 to W3 are tuned to ensure that the channel layers with narrower widths are not etched, or not substantially etched, when forming the channel region of each GAA FET. Embodiments of the present disclosure ensure that performance of the SRAM cells and the STD cells may be optimized independently for their respective applications, thereby boosting the overall performance of the IC structure.

In one aspect, the present embodiments provide an integrated circuit (IC) structure that includes a memory cell having a first p-type active region, a first n-type active region, a second n-type active region, and a second p-type active region disposed lengthwise along a first direction and spaced from each other in a second direction perpendicular to the first direction. In some embodiments, each of the first and the second p-type active regions includes a first group of vertically stacked channel layers having a width W1 measured along the second direction, and each of the first and the second n-type active regions includes a second group of vertically stacked channel layers having a width W2 measured along the second direction, where the width W2 is less than the width W1. In some embodiments, each of the first p-type active region, the first n-type active region, the second n-type active region, and the second p-type active region extends along the first direction across a boundary of the memory cell.

In another aspect, the present embodiments provide an IC structure that includes a logic standard cell having an n-type active region and a p-type active region oriented lengthwise along a first direction and spaced from each other along a second direction perpendicular to the first direction. In some embodiments, the n-type active region includes a first group of vertically stacked channel layers having a width W1 measured along the second direction, and the p-type active region includes a second group of vertically stacked channel layers having a width W2 measured along the second direction, where the width W1 is greater than or equal to the width W2. The IC further includes a metal gate structure oriented lengthwise along the second direction and configured to engage with the first plurality of vertically stacked channel layers to form a p-type device and with the second plurality of vertically stacked channel layers to form an n-type device.

In yet another aspect, the present embodiments provide an IC structure that includes a memory cell having a first p-type fin, a first n-type fin, a second n-type fin, and a second p-type fin disposed lengthwise along a first direction and spaced from each other along a second direction perpendicular to the first direction. In some embodiments, each of the first and the second p-type fins includes a first group of vertically stacked channel layers having a width W1 measured along the second direction, and each of the first and the second n-type fins includes a second group of vertically stacked channel layers having a width W2 measured along the second direction, where the width W2 is less than the width W1. In further embodiments, each of the first p-type fin, the first n-type fin, the second n-type fin, and the second p-type fin is continuous across a boundary of the memory cell. The IC structure further includes a standard logic cell having a third n-type fin and a third p-type fin oriented lengthwise along the first direction and spaced from each other along the second direction. In some embodiments, the third n-type fin includes a third group of vertically stacked channel layers having a width W3 measured along the second direction, and the third p-type fin includes a fourth group of vertically stacked channel layers having a width W4 measured along the second direction, where the width W3 is greater than or equal to the width W4. Still further, the IC structure includes metal gate structures disposed over the first, the second, and the third n-type fins to form p-type devices and over the first, the second, and the third p-type fins to form n-type devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
    a memory cell including a first p-type active region, a first n-type active region, a second n-type active region, and a second p-type active region disposed lengthwise along a first direction and spaced from each other in said order along a second direction substantially perpendicular to the first direction,
        wherein each of the first and the second p-type active regions includes a first plurality of vertically stacked channel layers having a width W1 measured along the second direction,
        wherein each of the first and the second n-type active regions includes a second plurality of vertically stacked channel layers having a width W2 measured along the second direction, the width W2 being less than the width W1, and
        wherein each of the first p-type active region, the first n-type active region, the second n-type active region, and the second p-type active region extends along the first direction across a boundary of the memory cell.

2. The IC structure of claim 1, wherein a ratio of the width W1 to the width W2 is about 1.1 to about 4.

3. The IC structure of claim 1, wherein the memory cell further includes:
    a first gate stack, a second gate stack, a third gate stack, and a fourth gate stack oriented lengthwise along the second direction, the first and the second gate stacks being spaced from the third and the fourth gate stacks along the first direction,
        wherein the first gate stack is disposed over the first p-type active region to provide a first n-type device,
        wherein the second gate stack is disposed over the first n-type active region, the second n-type active region, and the second p-type active region to provide a first p-type device, a second p-type device, and a second n-type device, respectively,
        wherein the third gate stack is disposed over the first p-type active region, the first n-type active region, and the second n-type active region to provide a third n-type device, a third p-type device, and a fourth p-type device, respectively, and
        wherein the fourth gate stack is disposed over the second p-type active region to provide a fourth n-type device.

4. The IC structure of claim 3, wherein each of the first and the fourth n-type devices is a pass-gate (PG) device, wherein each of the first and the fourth p-type devices is an isolation (IS) device, wherein each of the second and the third p-type devices is a pull-up (PU) device, and wherein each of the second and the third n-type devices is a pull-down (PD) device.

5. The IC structure of claim 4, wherein each IS device includes a drain terminal, a source terminal, and a gate terminal electrically coupled to the source terminal or to the drain terminal.

6. The IC structure of claim 1, wherein the memory cell is a first memory cell, the IC structure further comprising a second memory cell disposed adjacent to the first memory cell along the first direction, such that the first and the second p-type active regions and the first and the second n-type active regions extend along the first direction across both the first and the second memory cells.

7. The IC structure of claim 1, wherein the memory cell further includes a first, a second, a third, a fourth, and a fifth dielectric structure disposed lengthwise along the first direction and spaced from each other in said order along the second direction,
   wherein the first and the fifth dielectric structures are each disposed on a boundary of the memory cell,
   wherein the second dielectric structure is disposed between the first p-type active region and the first n-type active region,
   wherein the third dielectric structure is disposed between the first n-type active region and the second n-type active region, and
   wherein the fourth dielectric structure is disposed between the second n-type active region and the second p-type active region.

8. The IC structure of claim 7, wherein the first and the fifth dielectric structures are each defined by a width D1 along the second direction, wherein the second and the fourth dielectric structures are each defined by a width D2 along the second direction, and wherein the third dielectric structure is defined by a width D3 along the second direction, the widths D1, D2, and D3 being different.

9. The IC structure of claim 8, wherein the width D1 is greater than the width D2, and wherein the width D2 is greater than the width D3.

10. An integrated circuit (IC) structure, comprising:
   a logic standard cell including an n-type active region and a p-type active region oriented lengthwise along a first direction and spaced from each other along a second direction substantially perpendicular to the first direction,
      wherein the n-type active region includes a first plurality of vertically stacked channel layers having a width W1 measured along the second direction, and
      wherein the p-type active region includes a second plurality of vertically stacked channel layers having a width W2 measured along the second direction, the width W1 being greater than the width W2; and
   a metal gate structure oriented lengthwise along the second direction, wherein the metal gate structure engages with the first plurality of vertically stacked channel layers to form a p-type device and with the second plurality of vertically stacked channel layers to form an n-type device.

11. The IC structure of claim 10, wherein a ratio of the width W1 to the width W2 is about 1.1 to about 2.

12. The IC structure of claim 10, wherein the logic standard cell is a first logic standard cell, the n-type active region is a first n-type active region, and the p-type active region is a first p-type active region, the IC structure further comprising a second logic standard cell disposed adjacent to the first logic standard cell along the first direction,
   wherein the second standard logic cell includes a second n-type active region and a second p-type active region oriented along the first direction, and
   wherein a boundary between the first logic standard cell and the second logic standard cell is defined by a dielectric gate structure oriented lengthwise along the second direction, such that the dielectric gate structure physically separates the first n-type active region and the first p-type active region from the second n-type active region and the second p-type active region, respectively.

13. The IC structure of claim 12, wherein the first n-type active region and the second n-type active region have different lengths measured along the first direction, and wherein the first p-type active region and the second p-type active region have different lengths measured along the first direction.

14. The IC structure of claim 10, wherein the logic standard cell is a first logic standard cell, the IC structure further comprising a second logic standard cell disposed adjacent to the first logic standard cell along the first direction, wherein the n-type active region and the p-type active region extend along the first direction across a boundary between the first logic standard cell and the second logic standard cell.

15. The IC structure of claim 14, wherein the metal gate structure is a first metal gate structure, the p-type device is a first p-type device, and then-type device is a first n-type device, wherein the boundary is defined by a second metal gate structure, and wherein the second metal gate structure forms a second p-type isolation device with the n-type active region and a second n-type isolation device with the p-type active region.

16. The IC structure of claim 10, wherein the logic standard cell further includes:
   a first dielectric structure disposed at a first boundary of the logic standard cell and a second dielectric structure disposed at a second boundary of the logic standard cell and oriented lengthwise along the first direction, wherein each of the first and the second dielectric structures has a width D4 measured along the second direction, and
   a third dielectric structure disposed between the n-type active region and the p-type active region and oriented lengthwise along the first direction, wherein the third dielectric structure has a width D5 measured along the second direction, the width D5 being less than or equal to the width D4.

17. The IC structure of claim 10, wherein the n-type active region is a first n-type active region, and the p-type active region is a first p-type active region, the IC structure further comprising a memory cell that includes:
   a second p-type active region, a second n-type active region, a third n-type active region, and a third p-type active region disposed lengthwise along the first direction and spaced from each other in said order along the second direction,
      wherein each of the second and the third p-type active regions includes a third plurality of vertically stacked channel layers having a width W3 measured along the second direction,
      wherein each of the second and the third n-type active regions includes a fourth plurality of vertically stacked channel layers having a width W4 measured along the second direction, the width W4 being less than the width W3, and
      wherein each of the second p-type active region, the second n-type active region, the third n-type active region, and the third p-type active region extends along the first direction across a boundary of the memory cell.

18. An integrated circuit (IC) structure, comprising:
   a memory cell that includes a first p-type fin, a first n-type fin, a second n-type fin, and a second p-type fin disposed lengthwise along a first direction and spaced from each other in said order along a second direction substantially perpendicular to the first direction,
      wherein each of the first and the second p-type fins includes a first plurality of vertically stacked channel layers having a width W1 measured along the second direction,
      wherein each of the first and the second n-type fins includes a second plurality of vertically stacked channel layers having a width W2 measured along the second direction, the width W2 being less than the width W1, and
      wherein each of the first p-type fin, the first n-type fin, the second n-type fin, and the second p-type fin is continuous across a boundary of the memory cell;

a standard logic cell that includes a third n-type fin and a third p-type fin oriented lengthwise along the first direction and spaced from each other along the second direction,
- wherein the third n-type fin includes a third plurality of vertically stacked channel layers having a width W3 measured along the second direction, and
- wherein the third p-type fin includes a fourth plurality of vertically stacked channel layers having a width W4 measured along the second direction, the width W3 being greater than or equal to the width W4; and a plurality of metal gate structures disposed over the first, the second, and the third n-type fins to form p-type devices and over the first, the second, and the third p-type fins to form n-type devices.

19. The IC structure of claim 18, wherein the standard logic cell further includes an isolation gate structure disposed at a boundary of the standard logic cell, the isolation gate structure being configured to form a p-type isolation device with the third n-type fin and an n-type isolation device with the third p-type fin.

20. The IC structure of claim 18, wherein each of the third n-type fin and the third p-type fin is truncated at a boundary of the standard logic cell by a dielectric gate structure.

* * * * *